US012310246B2

(12) United States Patent
Chetlur et al.

(10) Patent No.: US 12,310,246 B2
(45) Date of Patent: May 20, 2025

(54) FABRICATING AN ELECTROCONDUCTIVE CONTACT ON A TOP SURFACE OF A TUNNELING MAGNETORESISTANCE ELEMENT

(71) Applicant: Allegro MicroSystems, LLC, Manchester, NH (US)

(72) Inventors: Sundar Chetlur, Frisco, TX (US); Maxim Klebanov, Palm Coast, FL (US); Yen Ting Liu, Hsinchu (TW); Paolo Campiglio, Arcueil (FR)

(73) Assignee: Allegro MicroSystems, LLC, Manchester, NH (US)

( * ) Notice: Subject to any disclaimer, the term of this patent is extended or adjusted under 35 U.S.C. 154(b) by 466 days.

(21) Appl. No.: 17/804,680

(22) Filed: May 31, 2022

(65) Prior Publication Data
US 2023/0413679 A1    Dec. 21, 2023

(51) Int. Cl.
*G01R 33/00*    (2006.01)
*G01R 33/09*    (2006.01)
*H10N 50/01*    (2023.01)

(52) U.S. Cl.
CPC .......... *H10N 50/01* (2023.02); *G01R 33/0052* (2013.01); *G01R 33/093* (2013.01); *G01R 33/098* (2013.01)

(58) Field of Classification Search
CPC ............................ G01R 33/098; G01R 33/093; G01R 33/0017; G01R 33/0052; H01F 27/2804;

(Continued)

(56) References Cited

U.S. PATENT DOCUMENTS 16,047 A * 11/1856 Cooley ...................... E05B 3/04
                                                    292/355
5,496,759 A * 3/1996 Yue ......................... H10N 50/01
                                                    257/E43.006

(Continued)

FOREIGN PATENT DOCUMENTS

DE    10 2006 010 652 A1    9/2007

OTHER PUBLICATIONS

U.S. Appl. No. 15/802,780, filed Nov. 3, 2017, Fernon et al.
(Continued)

*Primary Examiner* — Maliheh Malek
(74) *Attorney, Agent, or Firm* — DALY, CROWLEY, MOFFORD & DURKEE, LLP

(57) ABSTRACT

In one aspect, a method includes depositing a capping layer on a semiconductor device structure. The semiconductor device includes a plurality of tunneling magnetoresistance (TMR) elements, a corresponding one hard mask on each TMR element, a metal layer, and a plurality of electroconductive vias directly connecting the TMR elements to the metal layer. The method further includes depositing an insulator on the capping layer, depositing a first photoresist on the insulator, patterning the first photoresist using photolithography to expose portions of the insulator, etching the exposed portions of the insulator and the hard masks to expose top surfaces of the TMR elements, stripping the first photoresist, and depositing a conducting material on the top surfaces of the TMR elements to form an electroconductive contact.

20 Claims, 40 Drawing Sheets

(58) Field of Classification Search
CPC ........ H01F 27/32; H01F 41/041; H01F 41/12; H01F 5/003; H01F 27/40; H01F 41/302; H01F 41/34; H01F 10/06; H01F 41/308; H10N 50/01; H10N 50/80; H10N 50/85; H10N 50/10
See application file for complete search history.

(56) References Cited

U.S. PATENT DOCUMENTS

| | | | | |
|---|---|---|---|---|
| 6,291,335 | B1* | 9/2001 | Schnabel | H10B 12/09 257/E21.507 |
| 6,383,863 | B1* | 5/2002 | Chiang | H10B 12/485 257/E21.018 |
| 6,473,275 | B1* | 10/2002 | Gill | B82Y 10/00 |
| 6,486,060 | B2* | 11/2002 | Hermes | H01L 21/76889 257/E21.507 |
| 6,627,913 | B2* | 9/2003 | Chen | B82Y 10/00 257/E27.005 |
| 7,501,672 | B2* | 3/2009 | Fishburn | H01L 21/28052 257/213 |
| 7,723,128 | B2 | 5/2010 | Wang et al. | |
| 8,835,190 | B2* | 9/2014 | Kaneko | H01L 23/5227 257/E21.665 |
| 8,848,320 | B1* | 9/2014 | David | G01R 33/096 360/327 |
| 8,885,302 | B1* | 11/2014 | David | G01R 33/0052 360/327 |
| 9,812,637 | B2* | 11/2017 | Fermon | H10N 50/85 |
| 10,050,193 | B1 | 8/2018 | Klebanov et al. | |
| 10,566,526 | B1* | 2/2020 | Liu | H10N 50/85 |
| 10,847,711 | B2 | 11/2020 | Deshpande et al. | |
| 10,916,438 | B2* | 2/2021 | Klebanov | H10D 64/691 |
| 11,005,036 | B2 | 5/2021 | Liu et al. | |
| 11,296,247 | B2* | 4/2022 | Cadugan | H10F 30/2235 |
| 11,476,415 | B2* | 10/2022 | Chung | H10N 50/10 |
| 11,630,169 | B1* | 4/2023 | Liu | H01F 27/2804 324/252 |
| 11,782,105 | B2* | 10/2023 | Klebanov | G01R 33/098 324/244 |
| 2002/0151151 | A1* | 10/2002 | Green | H10B 12/318 257/E21.012 |
| 2002/0186011 | A1* | 12/2002 | Murata | H10N 59/00 257/E27.005 |
| 2003/0047728 | A1* | 3/2003 | Chen | H10B 61/00 257/E27.005 |
| 2004/0004884 | A1* | 1/2004 | Miethaner | G11C 11/02 257/E27.005 |
| 2004/0012056 | A1* | 1/2004 | Nejad | G11C 11/15 257/E27.005 |
| 2004/0014243 | A1* | 1/2004 | Drewes | H10B 61/00 257/E27.005 |
| 2007/0108543 | A1* | 5/2007 | Furuta | H10B 61/22 257/E21.665 |
| 2007/0123023 | A1* | 5/2007 | Kim | H10N 50/01 438/618 |
| 2009/0015252 | A1* | 1/2009 | Raberg | G01R 33/093 324/252 |
| 2011/0169488 | A1* | 7/2011 | Mather | G01R 33/0035 324/252 |
| 2012/0212218 | A1* | 8/2012 | Fu | G01R 33/093 324/252 |
| 2015/0194597 | A1* | 7/2015 | Fermon | H01F 41/306 257/421 |
| 2015/0200355 | A1* | 7/2015 | Erie | H10N 50/01 257/421 |
| 2016/0180869 | A1* | 6/2016 | Zhang | G11B 5/3909 428/811.1 |
| 2016/0260772 | A1* | 9/2016 | Usami | H10N 50/10 |
| 2017/0062699 | A1 | 3/2017 | Huang et al. | |
| 2017/0084828 | A1 | 3/2017 | Hsu | |
| 2017/0184690 | A1* | 6/2017 | Deak | H10N 50/01 |
| 2018/0033955 | A1* | 2/2018 | Wong | H10N 50/85 |
| 2018/0074016 | A1* | 3/2018 | Chen | G01R 33/098 |
| 2020/0066580 | A1* | 2/2020 | Peng | H01L 21/31056 |
| 2020/0066967 | A1* | 2/2020 | Suri | H10N 50/10 |
| 2020/0266337 | A1* | 8/2020 | Liu | H10N 50/01 |
| 2020/0300940 | A1* | 9/2020 | Isler | G01R 33/093 |
| 2021/0057642 | A1* | 2/2021 | Liu | H10N 50/01 |
| 2021/0351341 | A1* | 11/2021 | Sasaki | H10N 50/85 |
| 2023/0228828 | A1* | 7/2023 | Klebanov | G01R 3/00 324/244 |
| 2024/0074322 | A1* | 2/2024 | Klebanov | H01F 41/34 |
| 2024/0324470 | A1* | 9/2024 | Akiyama | H10N 50/10 |
| 2024/0349616 | A1* | 10/2024 | Yang | H10N 50/80 |

OTHER PUBLICATIONS

U.S. Appl. No. 17/648,151, filed Jan. 17, 2022, Klebanov et al.
U.S. Appl. No. 17/648,154, filed Jan. 17, 2022, Liu et al.
U.S. Appl. No. 16/047,342, filed Jul. 27, 2018, Campiglio et al.
U.S. Non-Final Office Action dated Jun. 13, 2019 for U.S. Appl. No. 15/600,186; 15 Pages.
U.S. Non-Final Office Action dated Jun. 14, 2019 for U.S. Appl. No. 15/991,491; 15 Pages.
U.S. Restriction Requirement dated Feb. 7, 2020 for U.S. Appl. No. 16/280,199; 6 Pages.
Response to U.S. Restriction Requirement dated Feb. 7, 2020 for U.S. Appl. No. 16/280,199; Response Filed Feb. 26, 2020; 1 Page.
U.S. Non-Final Office Action dated Mar. 27, 2020 for U.S. Appl. No. 16/280,199; 10 Pages.
Response to U.S. Non-Final Office Action dated Mar. 27, 2020 for U.S. Appl. No. 16/280,199; Response Filed Jun. 25, 2020; 10 Pages.
U.S. Notice of Allowance dated Aug. 26, 2020 for U.S. Appl. No. 16/280,199; 13 Pages.
PCT International Search Report and Written Opinion of the ISA dated Sep. 26, 2019 for International Application No. PCT/US2019/037629; 13 Pages.
PCT International Preliminary Report dated Feb. 11, 2021 for International Application No. PCT/US2019/037629; 8 Pages.
U.S. Restriction Requirement dated May 8, 2020 for U.S. Appl. No. 16/047,342; 6 Pages.
Response to Restriction Requirement filed on Jun. 24, 2020 for U.S. Appl. No. 16/047,342; 1 page.
Office Action dated Oct. 14, 2020 for U.S. Appl. No. 16/047,342; 10 pages.
Response to Office Action filed on Dec. 29, 2020 for U.S. Appl. No. 16/047,342; 14 pages.
Final Office Action dated May 5, 2021 for U.S. Appl. No. 16/047,342; 15 pages.
Response to U.S. Final Office Action dated May 5, 2021 for U.S. Appl. No. 16/047,342; Response filed Jul. 2, 2021; 15 Pages.
Advisory Action dated Jul. 15, 2021 for U.S. Appl. No. 16/047,342; 2 Pages.
Preliminary Amendment (Supplemental Amendment) filed on Sep. 27, 2021 for U.S. Appl. No. 16/047,342; 10 Pages.
U.S. Notice of Allowance dated Oct. 1, 2021 for U.S. Appl. No. 16/047,342; 11 Pages.
Response (with Amended Claims) to European Communication dated Mar. 10, 2021 for European Application No. 19735086.1; Response filed Sep. 14, 2021; 27 Pages.
U.S. Non-Final Office Action dated Aug. 10, 2021 for U.S. Appl. No. 17/089,798; 9 Pages.
Response to U.S. Non-Final Office Action dated Aug. 10, 2021 for U.S. Appl. No. 17/089,798; Response filed Oct. 12, 2021; 7 Pages.
U.S. Final Office Action dated Nov. 15, 2021 for U.S. Appl. No. 17/089,798; 10 Pages.
U.S. Notice of Allowance dated Mar. 4, 2025 for U.S. Appl. No. 17/823,461; 10 Pages.

* cited by examiner

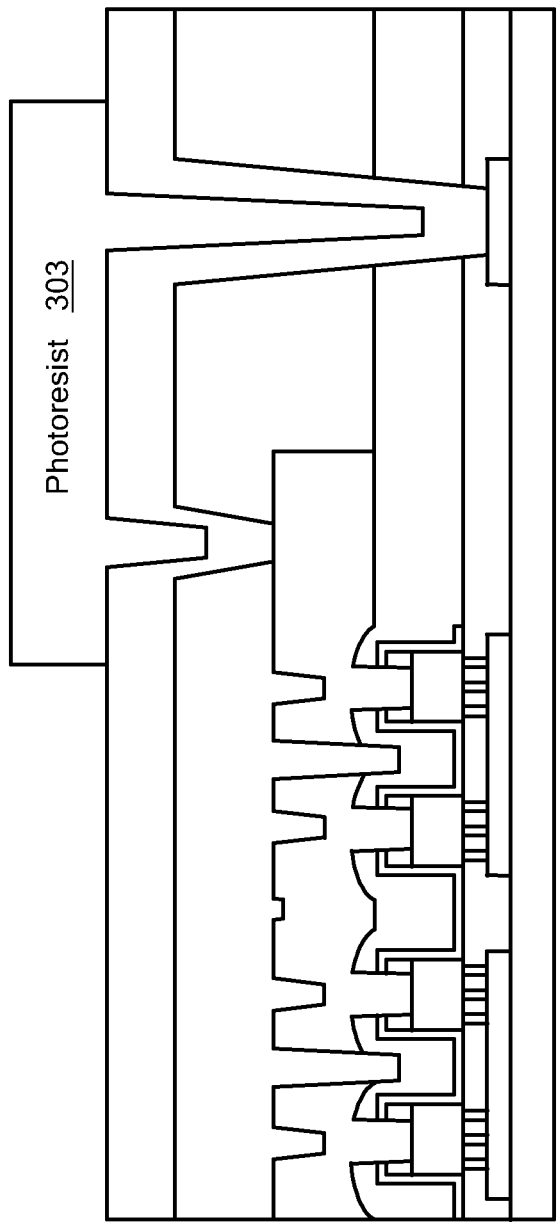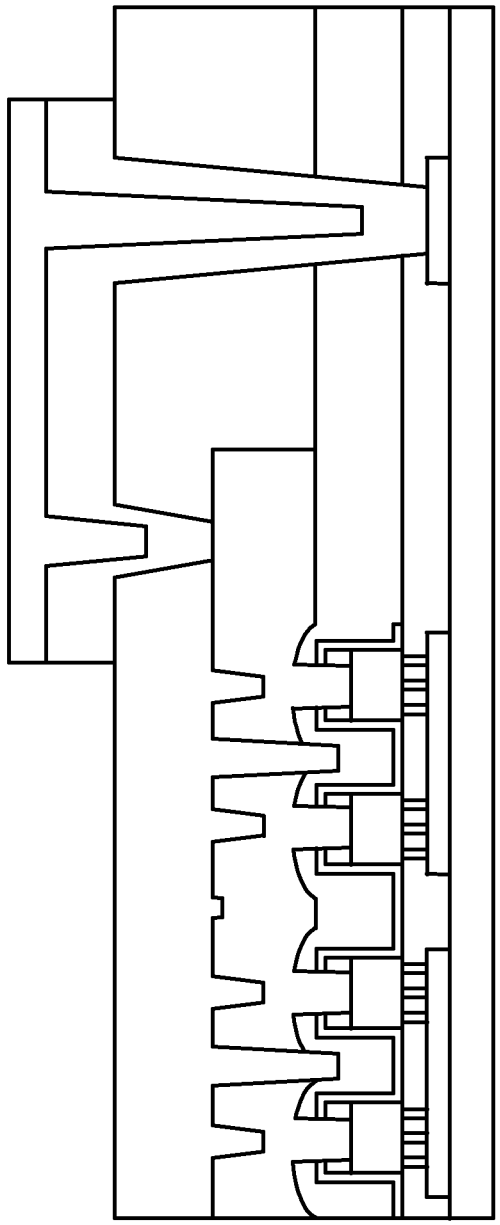
FIG. 3G
FIG. 3H

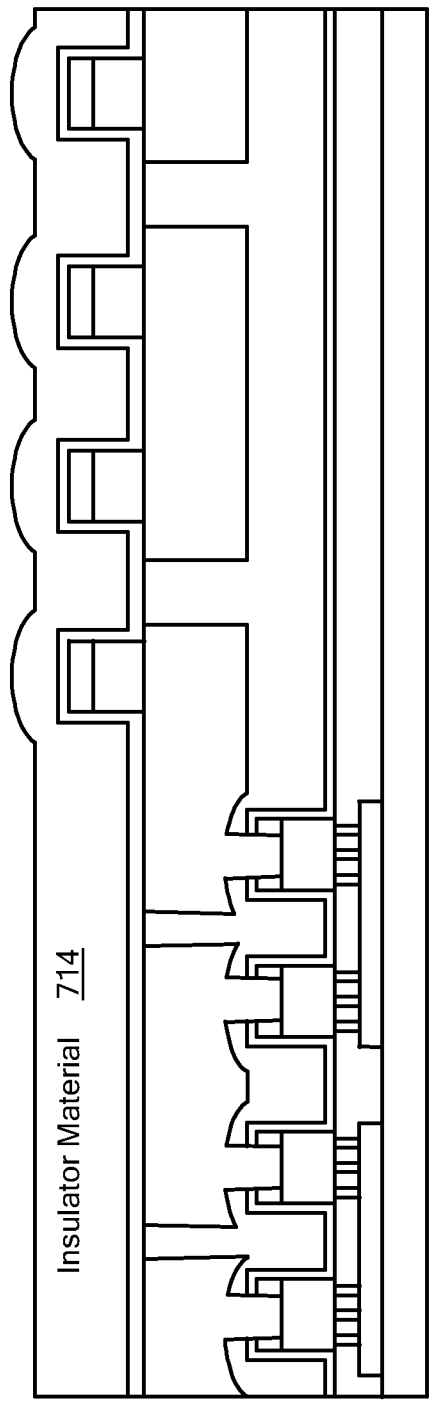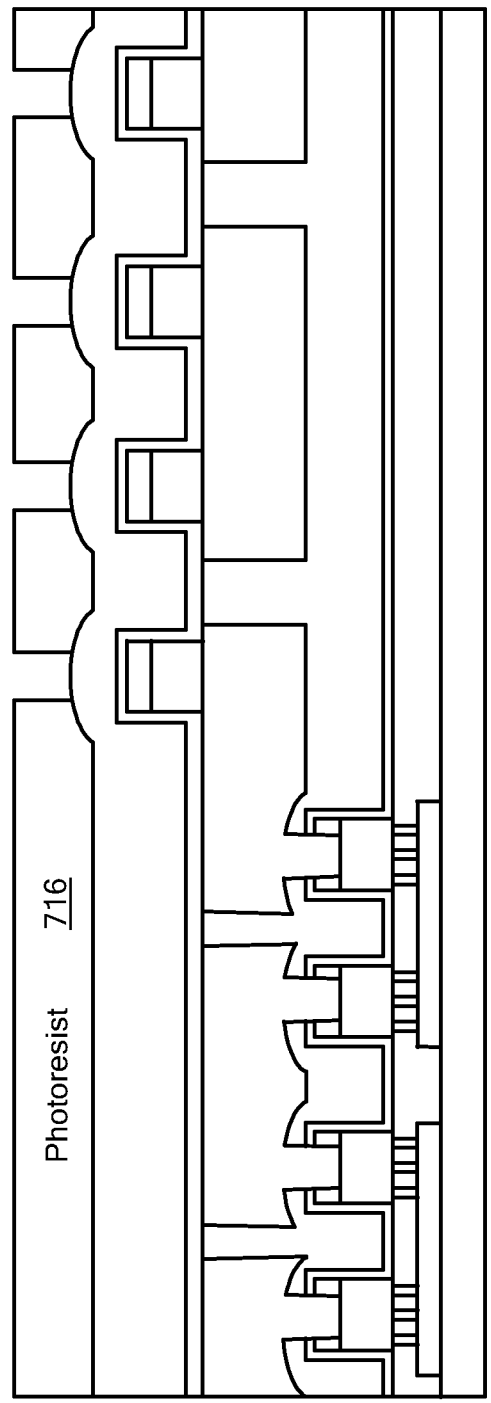

FABRICATING AN ELECTROCONDUCTIVE CONTACT ON A TOP SURFACE OF A TUNNELING MAGNETORESISTANCE ELEMENT

BACKGROUND

A magnetic field sensing element is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. There are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

SUMMARY

In one aspect, a method includes depositing a capping layer on a semiconductor device structure. The semiconductor device includes a plurality of tunneling magnetoresistance (TMR) elements, a corresponding one hard mask on each TMR element, a metal layer, and a plurality of electroconductive vias directly connecting the TMR elements to the metal layer. The method further includes depositing an insulator on the capping layer, depositing a first photoresist on the insulator, patterning the first photoresist using photolithography to expose portions of the insulator, etching the exposed portions of the insulator and the hard masks to expose top surfaces of the TMR elements, stripping the first photoresist, and depositing a conducting material on the top surfaces of the TMR elements to form an electroconductive contact.

In another aspect, a method includes depositing a capping layer over a semiconductor device structure that includes a plurality of tunneling magnetoresistance (TMR) elements, a corresponding one hard mask on each TMR element, a metal layer and a plurality of electroconductive vias directly connecting the TMR elements to the metal layer. The method also includes depositing a first insulator on the capping layer, depositing a first photoresist on the insulator, patterning the first photoresist using photolithography to expose portions of the first insulator, etching the exposed portions of the first insulator and the hard masks to expose top surfaces of the TMR elements, stripping the first photoresist, and depositing a conducting material on the top surfaces of the TMR elements to form an electroconductive contact.

In a further aspect, a method includes depositing an insulator on a capping layer of a semiconductor device structure that includes a tunneling magnetoresistance (TMR) element, a hard mask on the TMR element, and the capping layer on the hard mask. The method also includes depositing a first photoresist on the insulator, patterning the first photoresist using photolithography to expose portions of the insulator, etching the insulator, stripping the first photoresist, and depositing a metal on a top surface of the TMR element to form an electroconductive contact.

In a still further aspect, a method, includes depositing a capping layer on a semiconductor device structure that includes a plurality of magnetoresistance (MR) elements, a corresponding one hard mask on each MR element, a metal layer and a plurality of electroconductive vias directly connecting the MR elements to the metal layer. The method also includes depositing an insulator on the capping layer, depositing a first photoresist on the insulator, patterning the first photoresist using photolithography to expose portions of the insulator, etching the exposed portions of the insulator and the hard masks to expose top surfaces of the MR elements, stripping the first photoresist and depositing a conducting material on the top surfaces of the MR elements to form an electroconductive contact.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIGS. 3A to 3J are diagrams of another example to fabricate an electroconductive contact on a top surface of the TMR element;

DETAIL DESCRIPTION

Described herein are techniques to fabricate an electroconductive contact on a top surface of a tunneling magnetoresistance (TMR) element. In one example, titanium nitride is used to form the electroconductive contact because titanium nitride is deposited using a lower temperature (e.g., less than 100° C.) than most metals thereby not harming the TMR element from high temperature exposure. In one example, a diameter of the TMR element is a micron or less. While the detailed description herein focuses on TMR elements other types of magnetoresistance elements may be used.

As used herein the term "hard mask" is used to describe a type of barrier that is used during a photolithography/etch process, which can be distinguished from photoresist mask (i.e., soft mask). For example, the hard mask may include material such as silicon dioxide and/or silicon nitride. In some examples, the hard mask may include at least one of silicon dioxide, silicon nitride, polysilicon, and/or oxide-nitride-oxide (ONO). Alternatively, any other suitable materials may be used to form the hard mask, which can a) withstand oxidation process (i.e., not get burnt in a furnace) and/or b) provide a barrier against oxidation of silicon layer underneath.

Figure 1A:
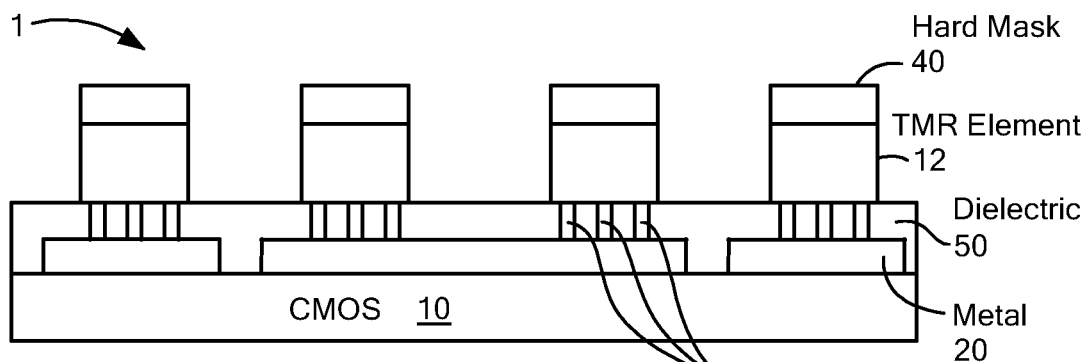
FIGS. 1A to 1Q are diagrams of an example to fabricate an electroconductive contact on a top surface of a tunneling magnetoresistance (TMR) element.
Figure 1B:
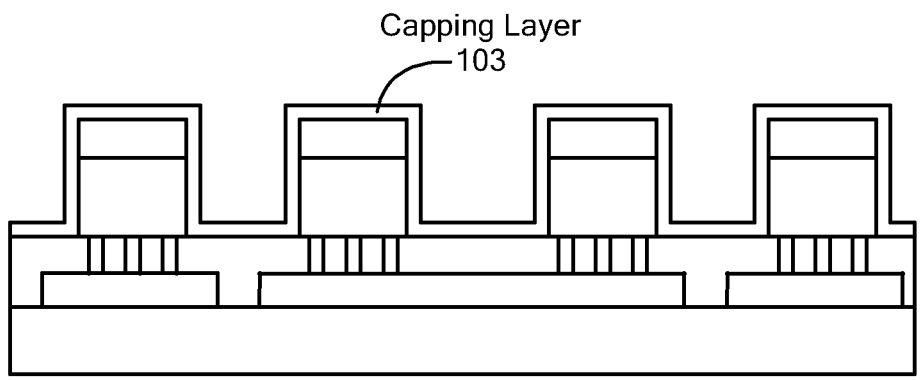
Figure 1C:
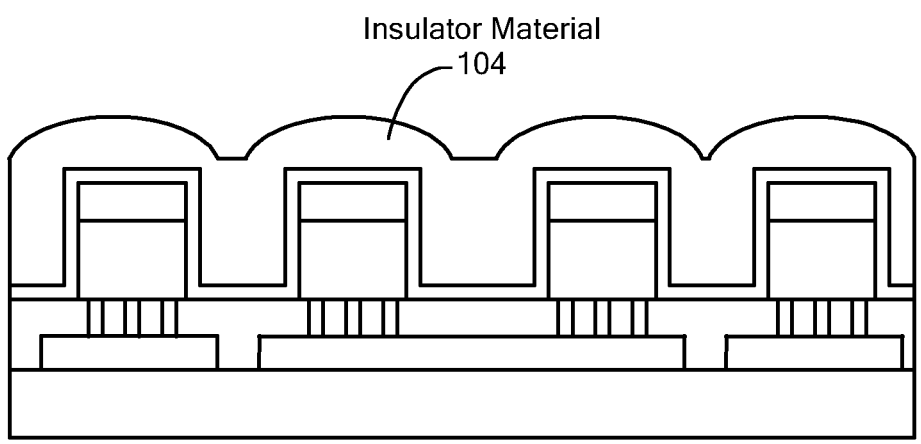
Figure 1D:
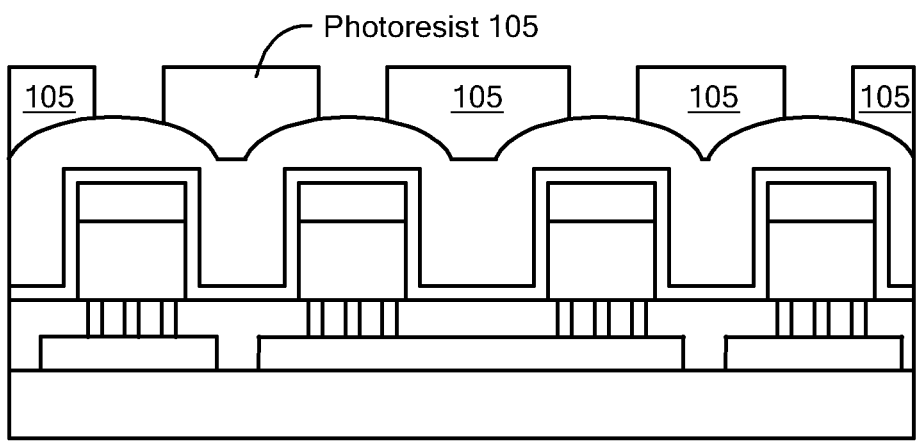
Figure 1E:
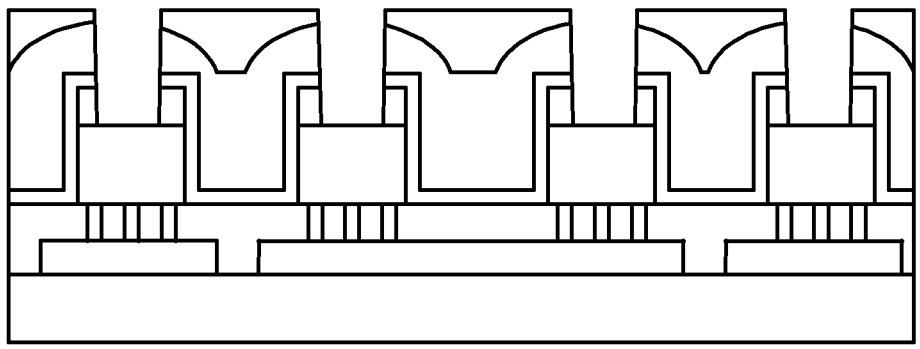
Figure 1F:
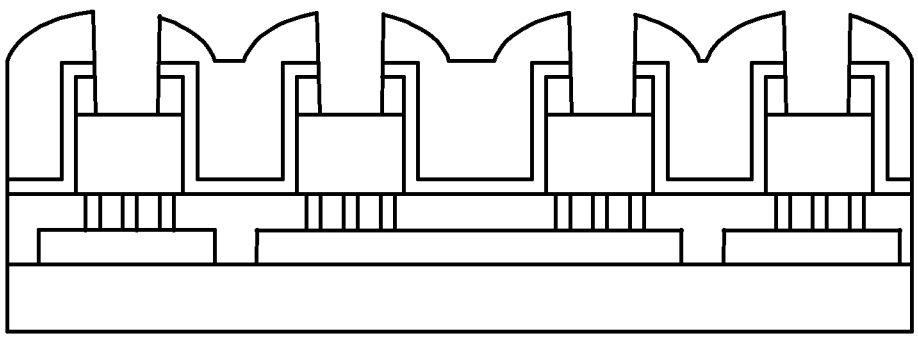
Figure 1G:
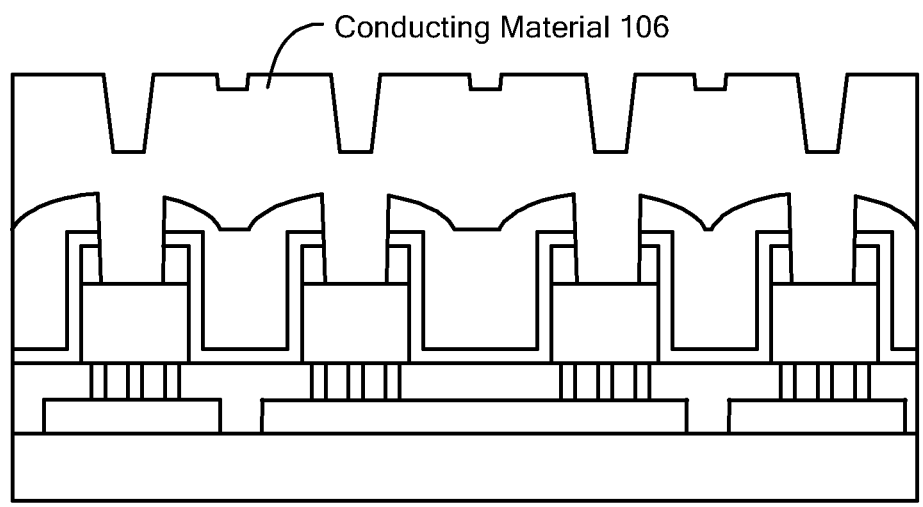
Figure 1H:
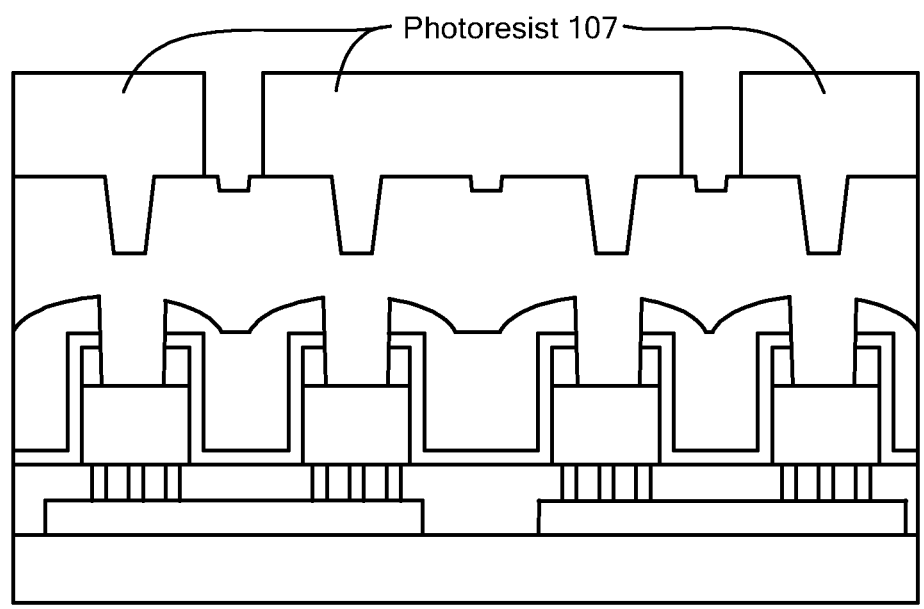
Figure 1I:
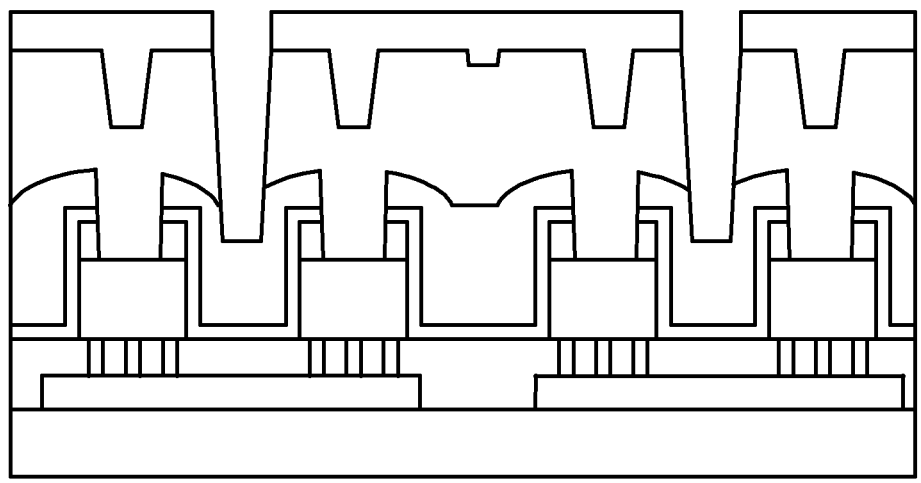
Figure 1J:
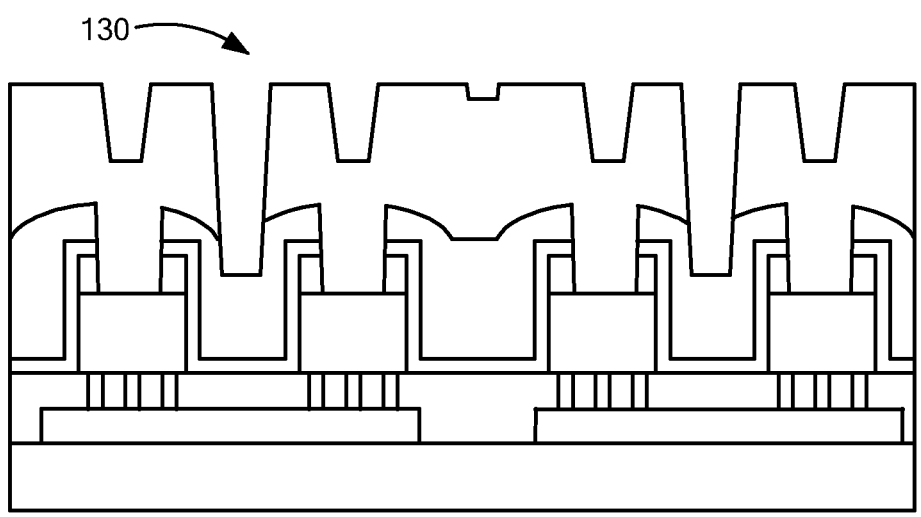
Figure 1K:
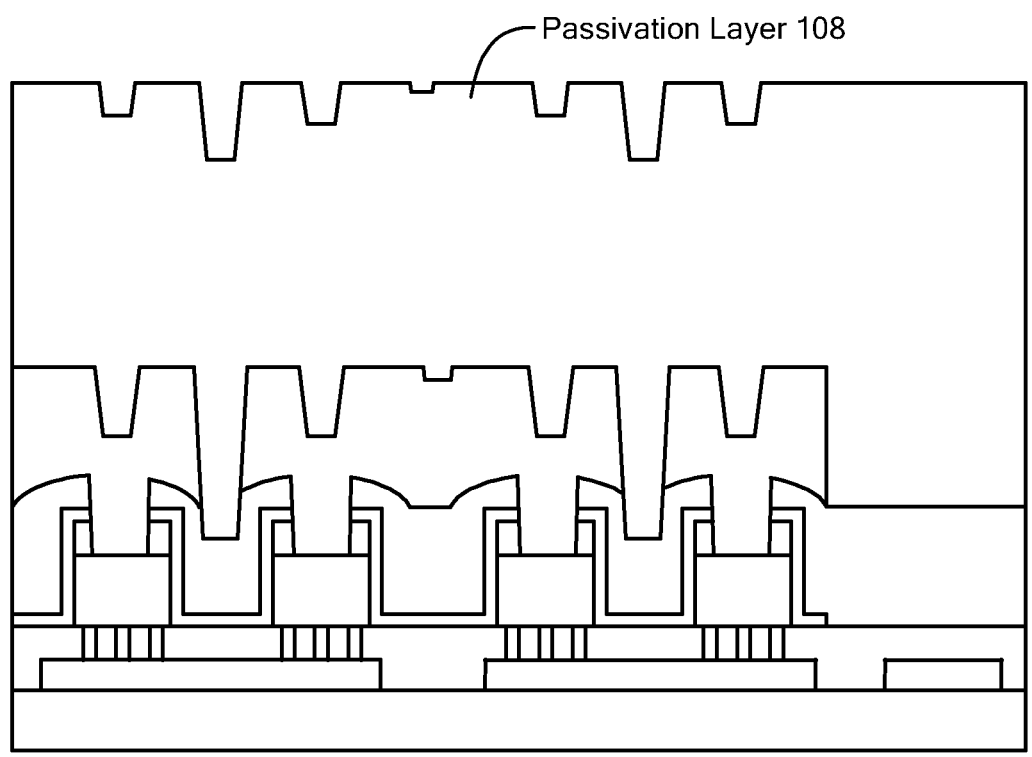
Figure 1L:
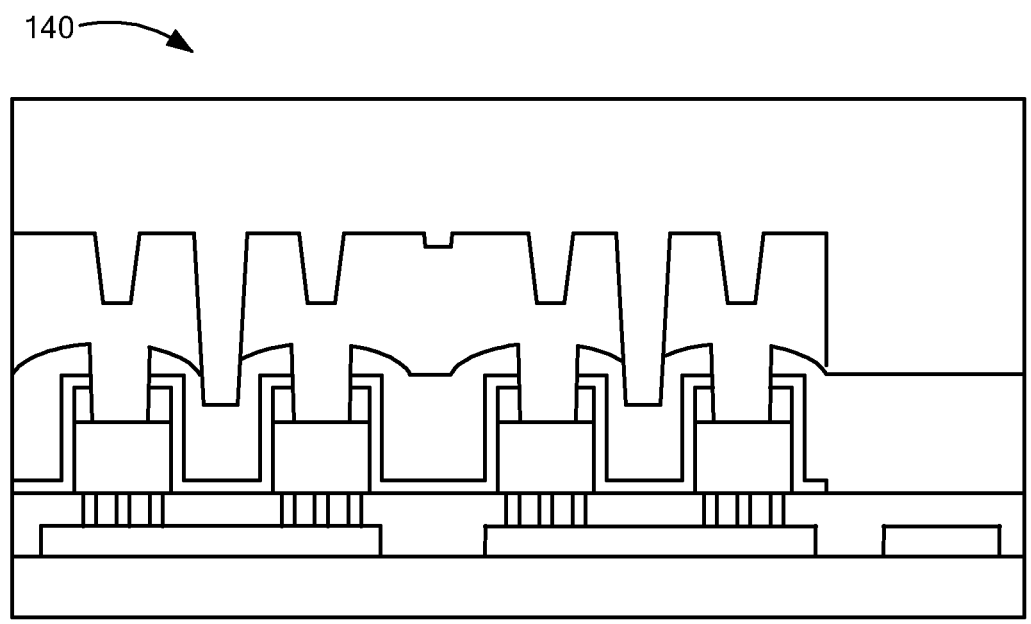
Figure 1M:
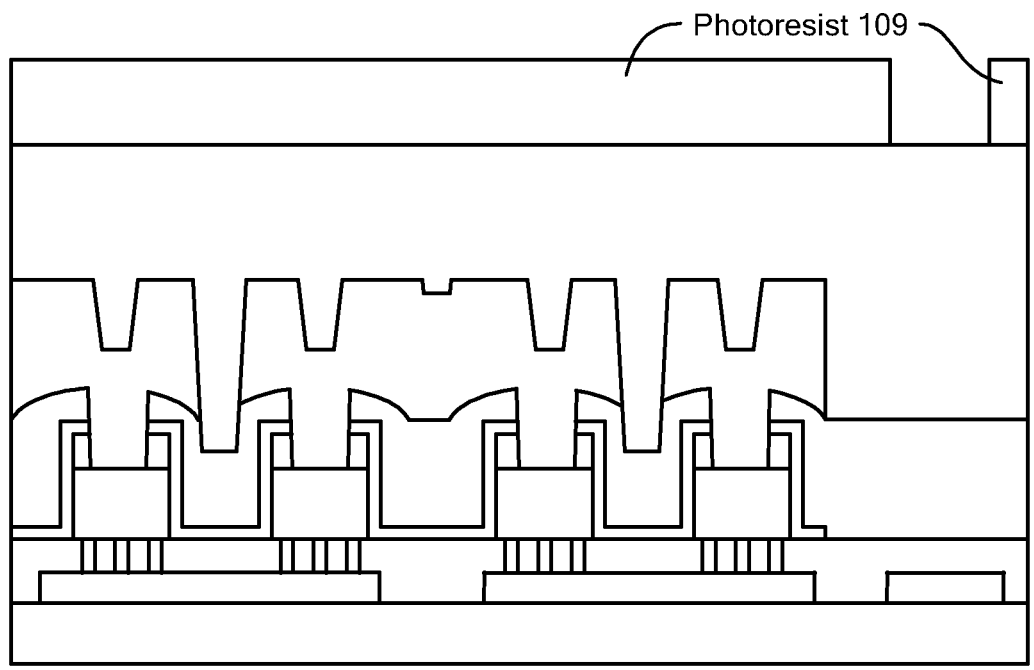
Figure 1N:
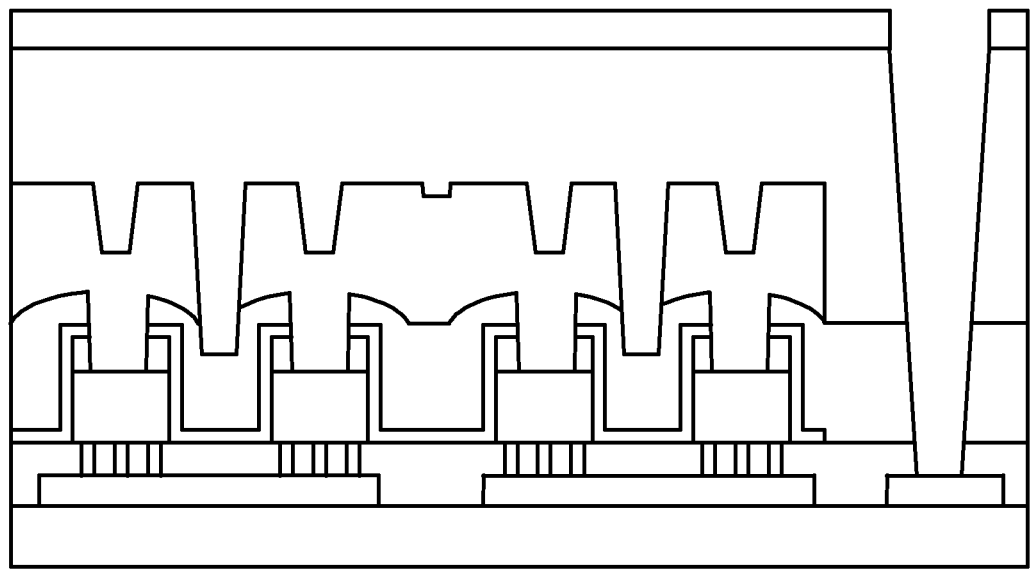
Figure 1O:
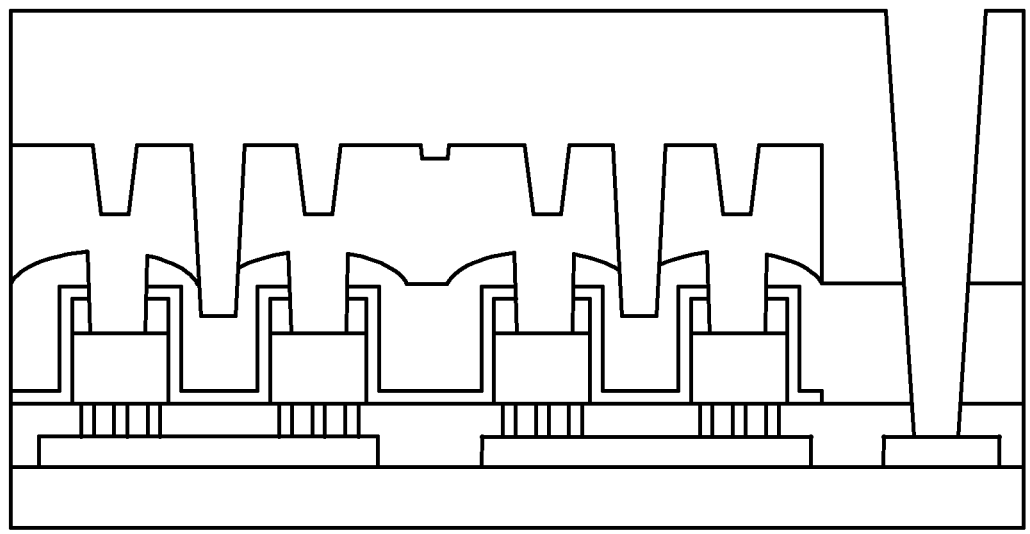
Figure 1P:
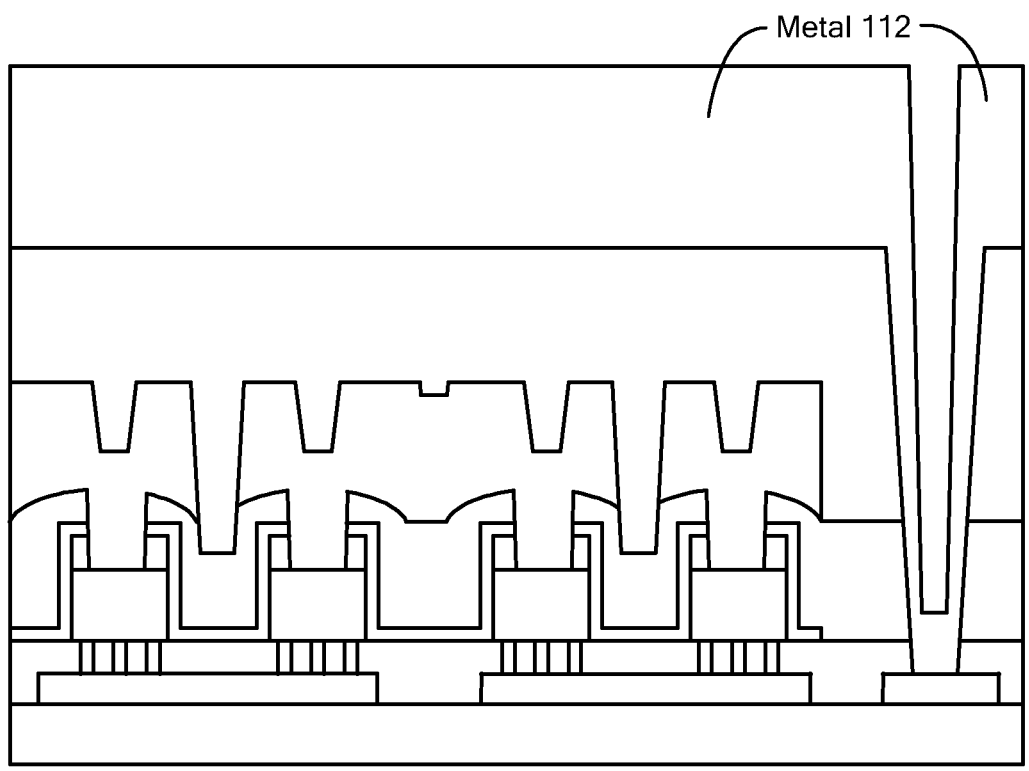
Figure 1Q:
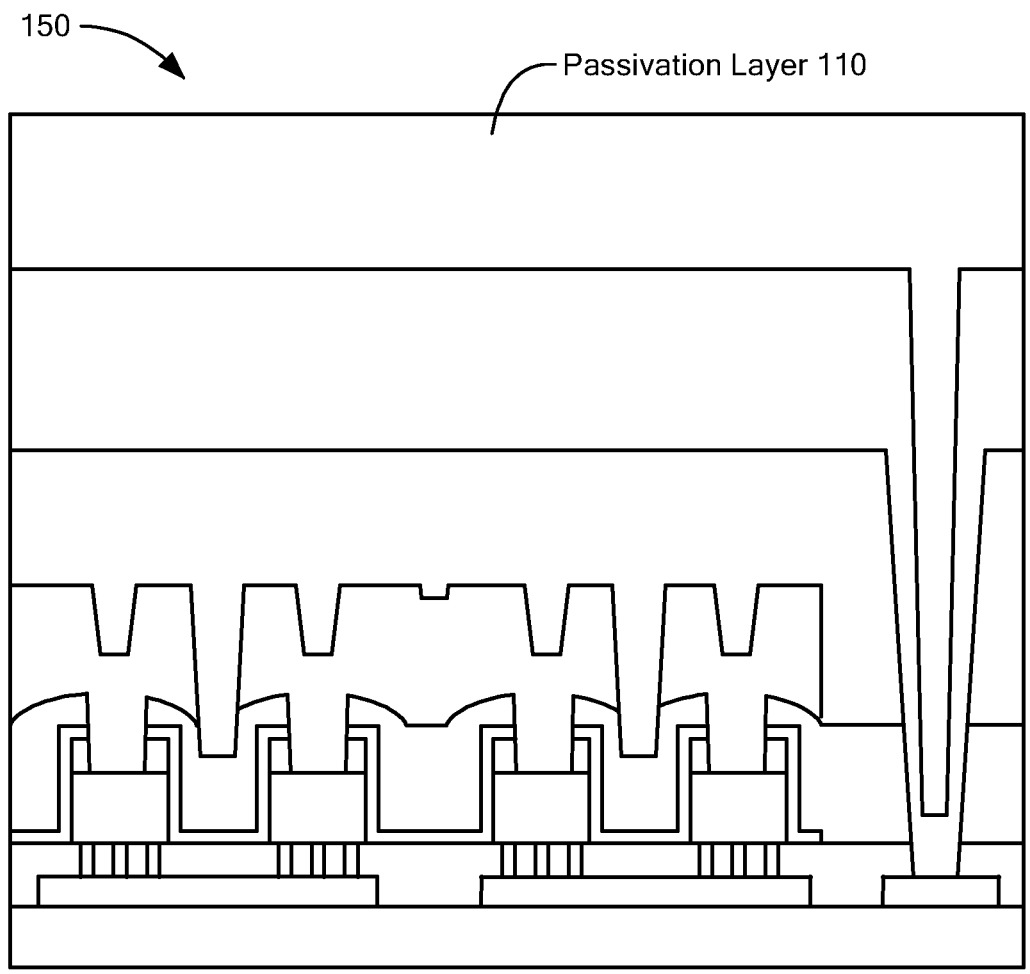

FIGS. 1A to 1Q depict one example to fabricate an electroconductive contact on a top surface of a TMR element 12. In one example, the process may begin with a complementary metal-oxide-semiconductor (CMOS) device structure.

One example of a CMOS device structure is a CMOS device structure 1, which includes a CMOS 10, a metal layer 20 in electroconductive contact with the CMOS 10. Vias 30 are in electroconductive contact with the metal layer 20 and in electroconductive contact with the TMR elements 12.

Each of the TMR elements 12 has a hard mask 40 on a top surface of the TMR elements 12. A dielectric 50 is on the CMOS 10 and the TMR elements 12 are on the dielectric 50. The vias 30 are formed in the dielectric 50. In one example, the dielectric 50 may be an oxide.

A capping layer 103 is deposited on the hard mask 40 and the dielectric 50. The capping layer 103 is also deposited on sidewalls of the TMR elements 12 to protect the TMR elements 12. For example, the capping layer 103 may protect a tunnelling barrier in a TMR element 12 from being shunted, for example, by any conductive material that may be re-deposited. In one example, the capping layer 103 may be silicon nitride.

An insulator 104 is deposited on the capping layer 103. In one example, the insulator 104 may be an oxide. In one particular example, the insulator 104 may be silicon dioxide.

A photoresist 105 is deposited and patterned to expose portions of the insulator 104. The exposed portions of the insulator 104 are etched down to and top surfaces of the TMR elements 12 are exposed.

After the first photoresist 105 is removed, a conducting material 106 is deposited directly on and in direct contact with the top surfaces of the TMR elements 12 to form an intermediate device 130. In one example, the conducting material 106 may be titanium nitride, which reduces chances of any gaps being formed. As will be further described herein, the conducting material 106 is a jumper (i.e., connector) between two TMR elements 12.

A second photoresist 107 is deposited and patterned to expose portions of the conducting material 106. The exposed portions of the conducting material 106 are etched down to the insulator 104 completing the formation of the jumpers between the TMR elements 12.

After the second photoresist 107 is removed, a first passivation layer 108 is deposited on the insulator 104 and the conducting material 106. In some examples, the passivation layer 108 may be silicon dioxide or silicon nitride. The first passivation layer 108 is planarized to form an intermediate device 140.

A third photoresist 109 is deposited and patterned to expose portions of the passivation layer 108. The exposed portions of the passivation layer 108 are etched down to the metal layer 102.

After the third photoresist 109 is removed, a metal material 112 is deposited on the metal layer 102. In some examples, the metal material 112 may be aluminum, copper and so forth. In one example, the metal 112 forms a coil configured to receive or radiate a magnetic field.

A second passivation layer 110 is deposited on the metal 112 to form a device 150. In some examples, the second passivation layer 110 may be silicon dioxide, silicon nitride and so forth.

Figure 2:
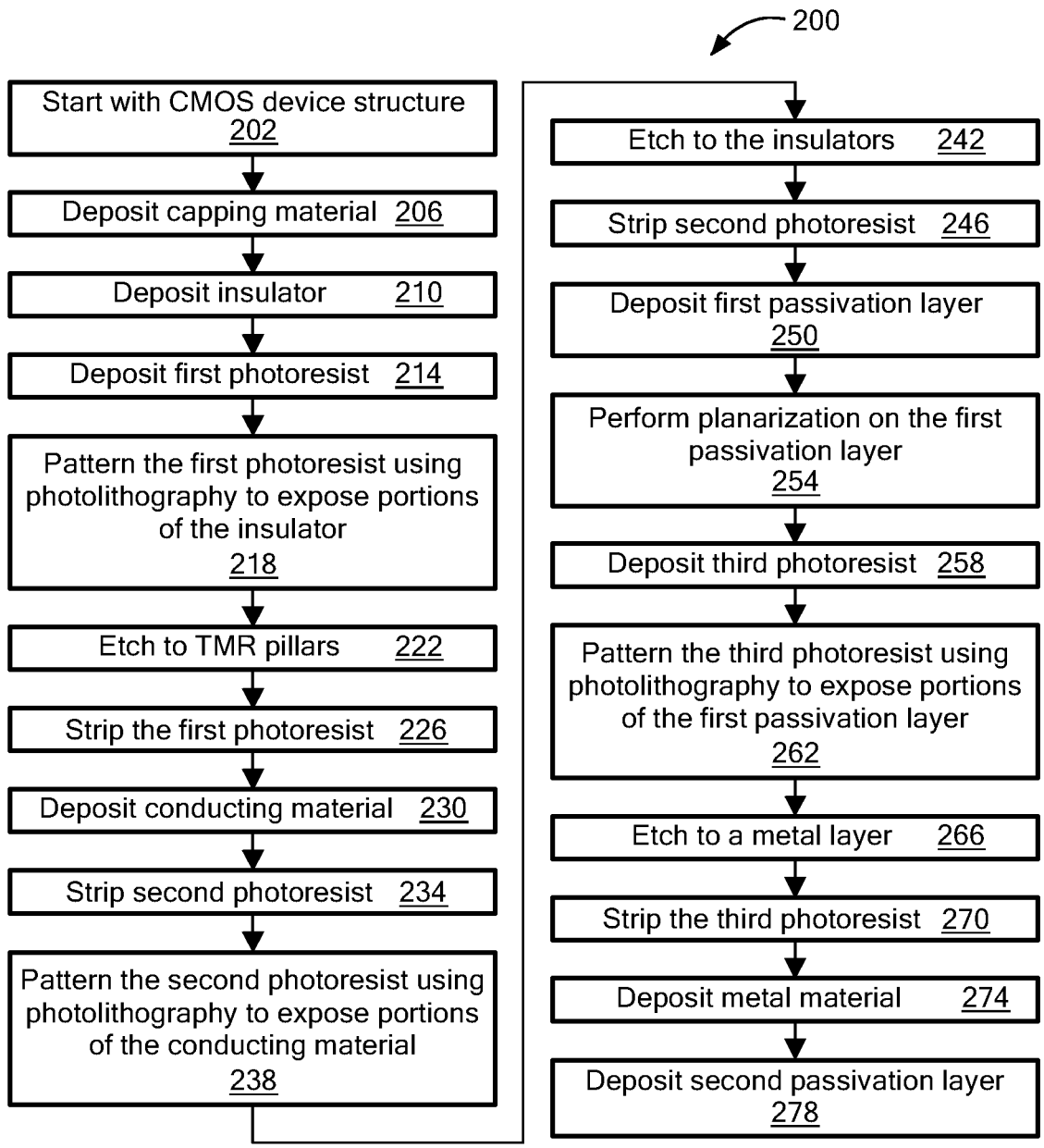
FIG. 2 is a flowchart of an example of a process to fabricate the electroconductive contact on the top surface of TMR element in FIGS. 1A to 1Q.

Referring to FIG. 2, an example of a process to fabricate an electroconductive contact on a top surface of a TMR element is a process 200. In one example, process 200 may be used to form the device 150 (FIG. 1Q).

Process 200 starts with a CMOS device structure (202). For example, process 200 starts with the CMOS device structure 2 (FIG. 1A).

Process 200 deposits a capping layer (206). For example, the capping material 103 may be deposited on the hard mask 40, the dielectric 50, and the sidewalls of the TMR elements using standard deposition techniques (FIG. 1B).

Process 200 deposits an insulator on the capping layer (210). For example, the insulator 104 is deposited on the capping layer 103 using standard low temperature (e.g., less than 200° C.) oxide deposition (FIG. 1C).

Process 200 deposits a first photoresist (214) and patterns the first photoresist using photolithography to expose portions of the insulator (218). For example, the first photoresist 105 is patterned using standard photolithographic techniques to expose portions of the insulator 104 (FIG. 1D).

Process 200 etches to the TMR elements (222). For example, the exposed portions of the insulator 104 may be dry etched to top surfaces of the TMR elements 12 (FIG. 1E).

Process 200 strips the first photoresist (226). For example, the first photoresist 105 is removed using standard photoresist stripping techniques (FIG. 1F).

Process 200 deposits a conducting material (230). For example, the conducting material 106 is deposited using standard low temperature (e.g., less than 200° C.) deposition techniques (FIG. 1G).

Process 200 deposits a second photoresist (234) and patterns the second photoresist using photolithography to expose portions of the conducting material (238). For example, the second photoresist 107 is patterned using standard photolithographic techniques to expose portions of the conducting material 106 (FIG. 1H).

Process 200 etches to the insulator (242). For example, the exposed portions of the conducting material 106 are etched down to the insulator 104 using standard etching techniques (FIG. 1I).

Process 200 strips the second photoresist (246). For example, the second photoresist 107 is removed using standard photoresist stripping techniques (FIG. 1J).

Process 200 deposits a first passivation layer (250). For example, the passivation layer 108 is deposited using standard deposition techniques (FIG. 1K).

Process 200 performs planarization on the first passivation layer (254). For example, the first passivation layer 108 is planarized using chemical mechanical polishing (CMP) techniques (FIG. 1L).

Process 200 deposits a third photoresist (258) and patterns the third photoresist using photolithography to expose portions of the first passivation layer (262). For example, the third photoresist 109 is patterned using standard photolithographic techniques to expose portions of the passivation layer 108 (FIG. 1M).

Process 200 etches to the metal layer (266). For example, the exposed portions of the passivation layer 108 are etched down to the metal layer 102 using standard etching techniques (FIG. 1N).

Process 200 strips the third photoresist (270). For example, the third photoresist 109 is removed using standard photoresist stripping techniques (FIG. 1O).

Process 200 deposits a metal material (274). For example, a metal material 112 is deposited directly on the metal layer 102 using standard deposition techniques (FIG. 1P).

Process 200 deposits a second passivation layer (278). For example, the passivation layer 110 is deposited on the metal material 112 using standard deposition techniques (FIG. 1Q).

FIGS. 3A to 3J depict another example to fabricate an electroconductive contact on a top surface of a TMR element. In one example, the process may begin with the intermediate device 140 (FIG. 1L) with the third photoresist 109 patterned differently than shown in FIG. 1M. In particular example, the third photoresist 109 is patterned to expose portions of the passivation layer 108 above the conducting material 106 and the exposed portions of the passivation layer 108 are etched down to the conducting material 106.

After the photoresist 109 is removed, a fourth photoresist 301 is deposited and patterned to expose portions of the first passivation layer 108. The exposed portions of the first passivation layer 108 are etched down to the metal layer 102 and to the conducting material 106.

After the fourth photoresist 301 is removed, a metal 302 is deposited on the exposed portions of the conducting material 106 and the metal layer 102. In some examples, the metal 112 may be aluminum, copper and so forth.

A fifth photoresist 303 is deposited and patterned to expose portions of the metal 302. The exposed portions of the metal 302 are etched.

After the fourth photoresist 301 is removed, a second passivation layer 304 is deposited on the metal 302 to form a device 350. In some examples, the second passivation layer 304 may be silicon dioxide, silicon nitride and so forth.

Figures 3A, 3B:
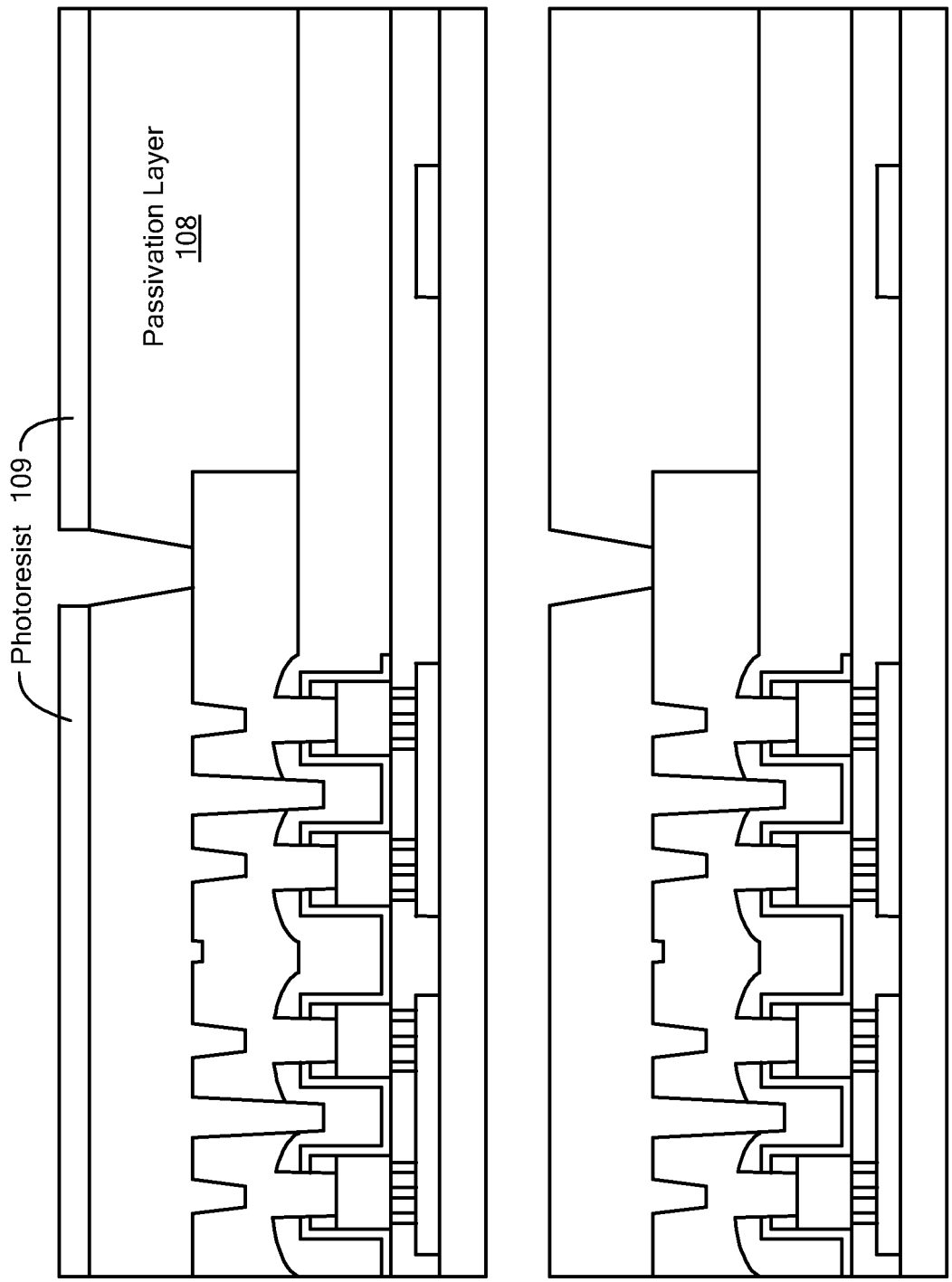
Figures 3C, 3D:
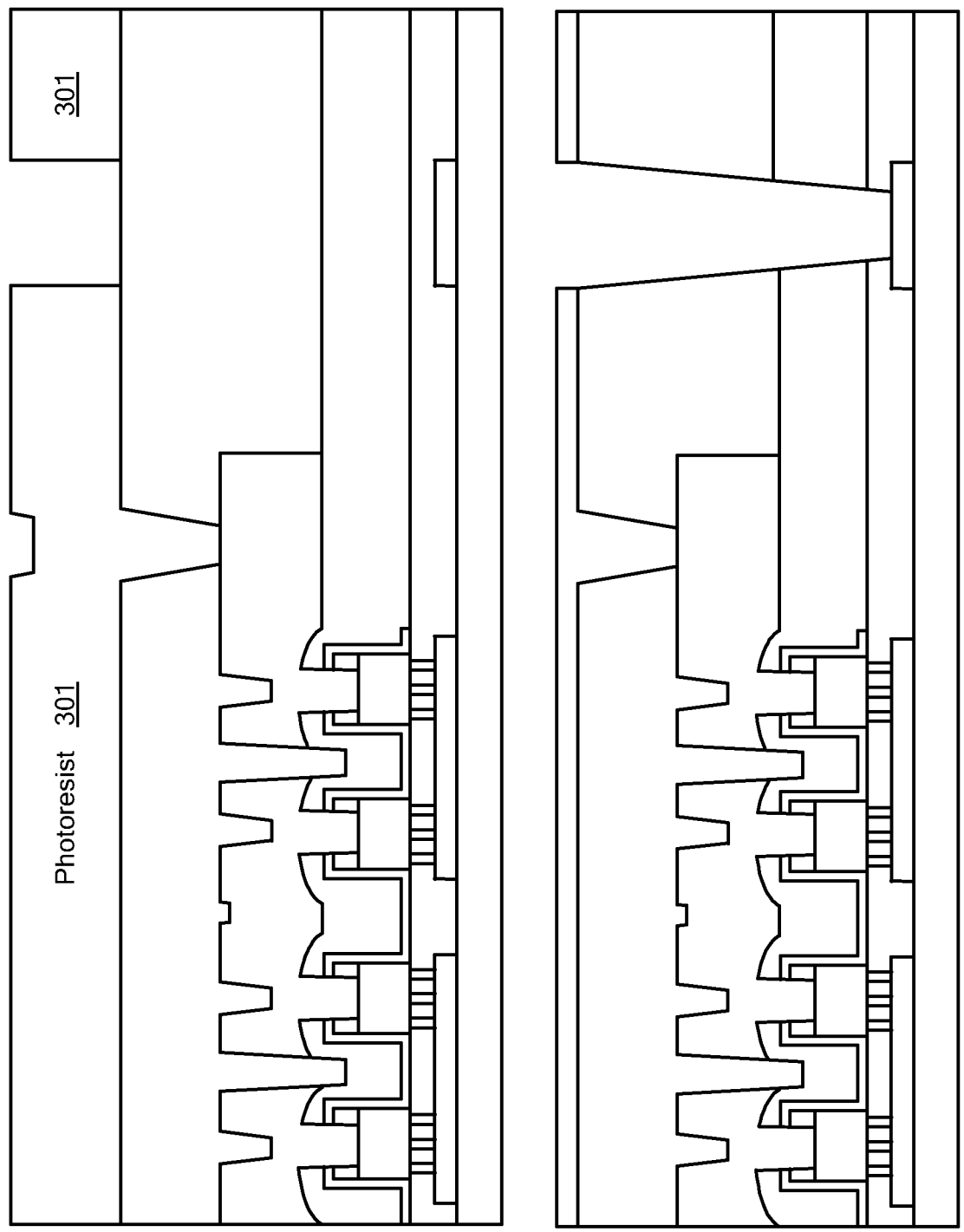
Figure 3E:
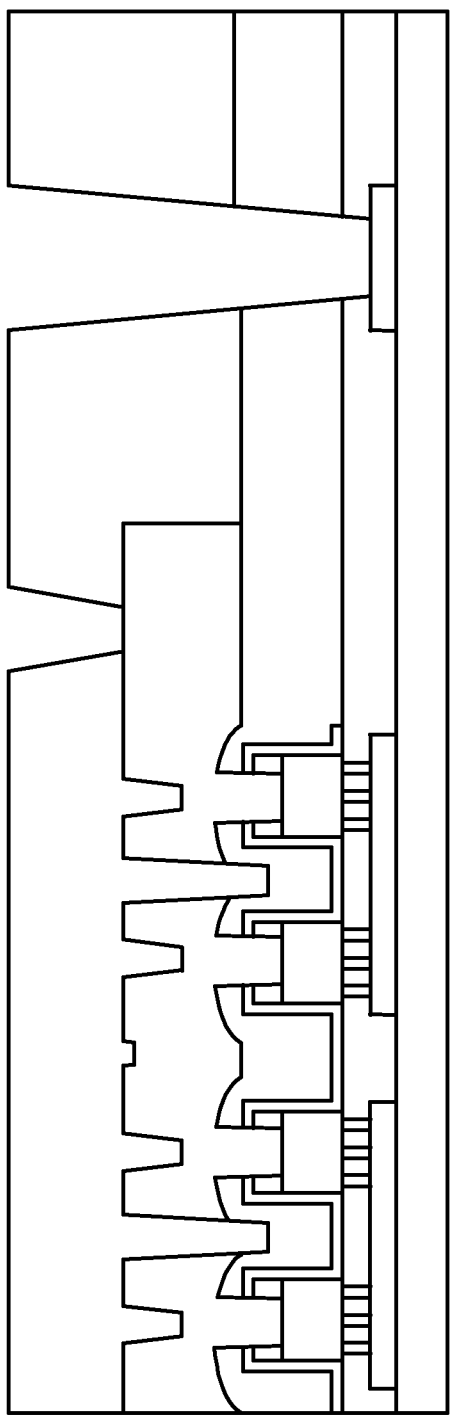
Figure 3F:
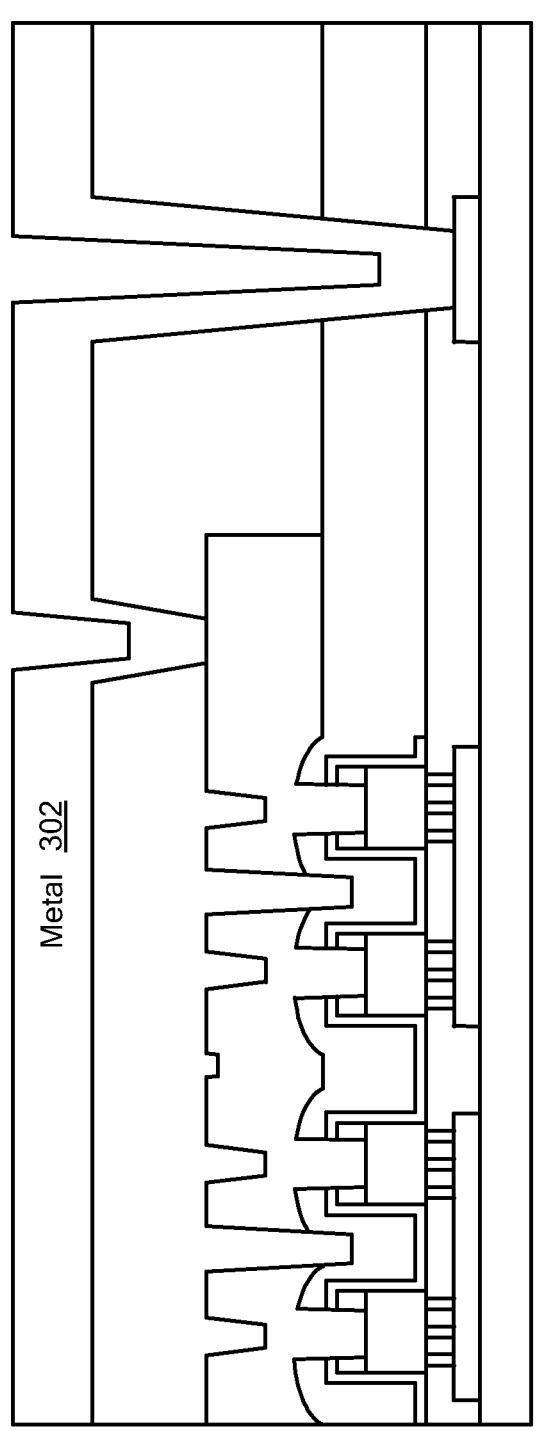
Figure 3I:
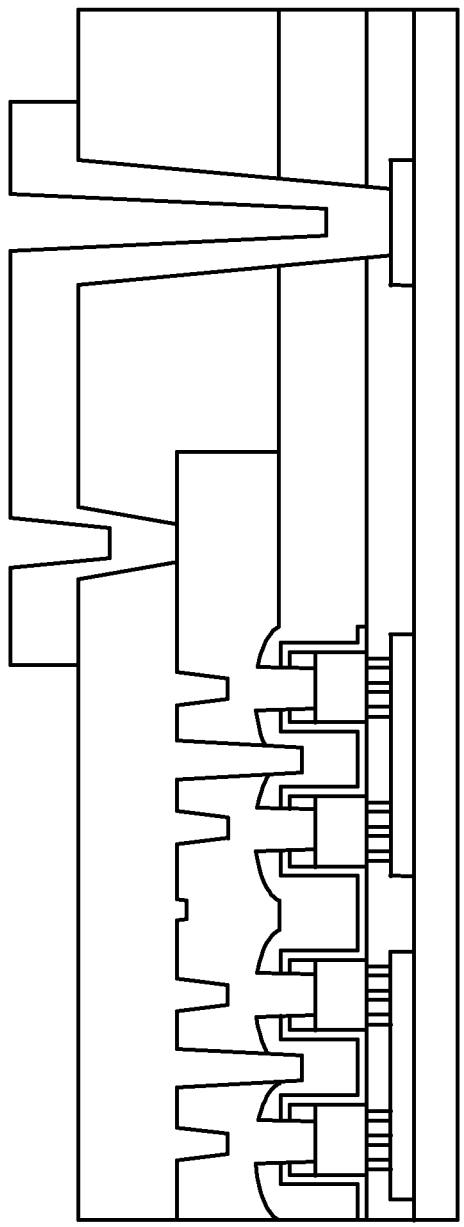
Figure 3J:
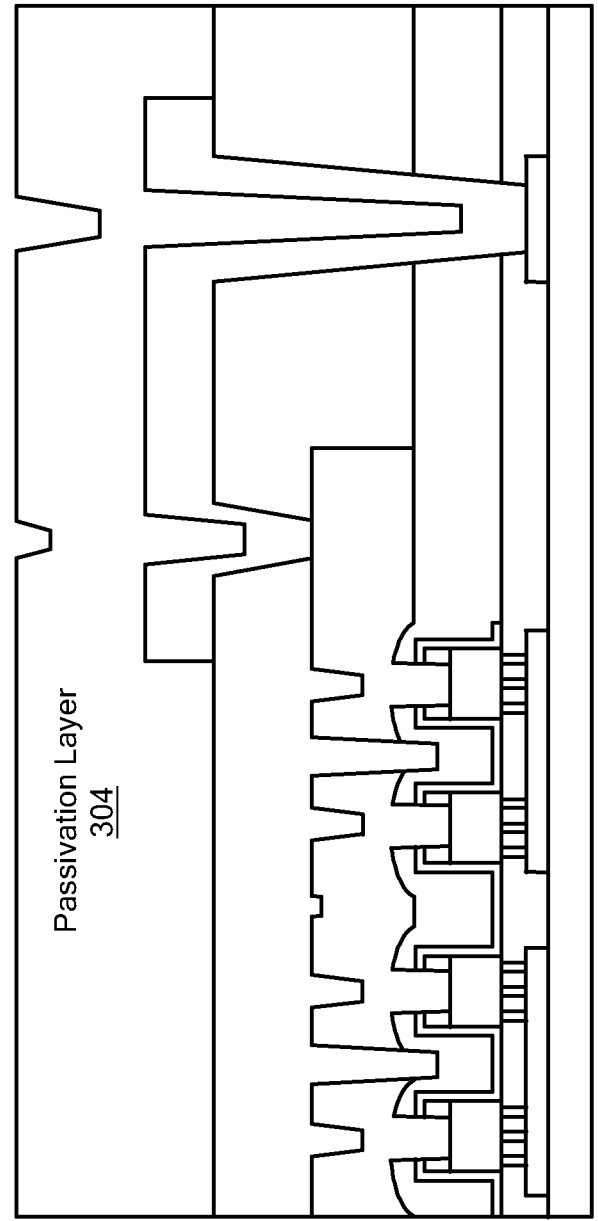
Figure 4:
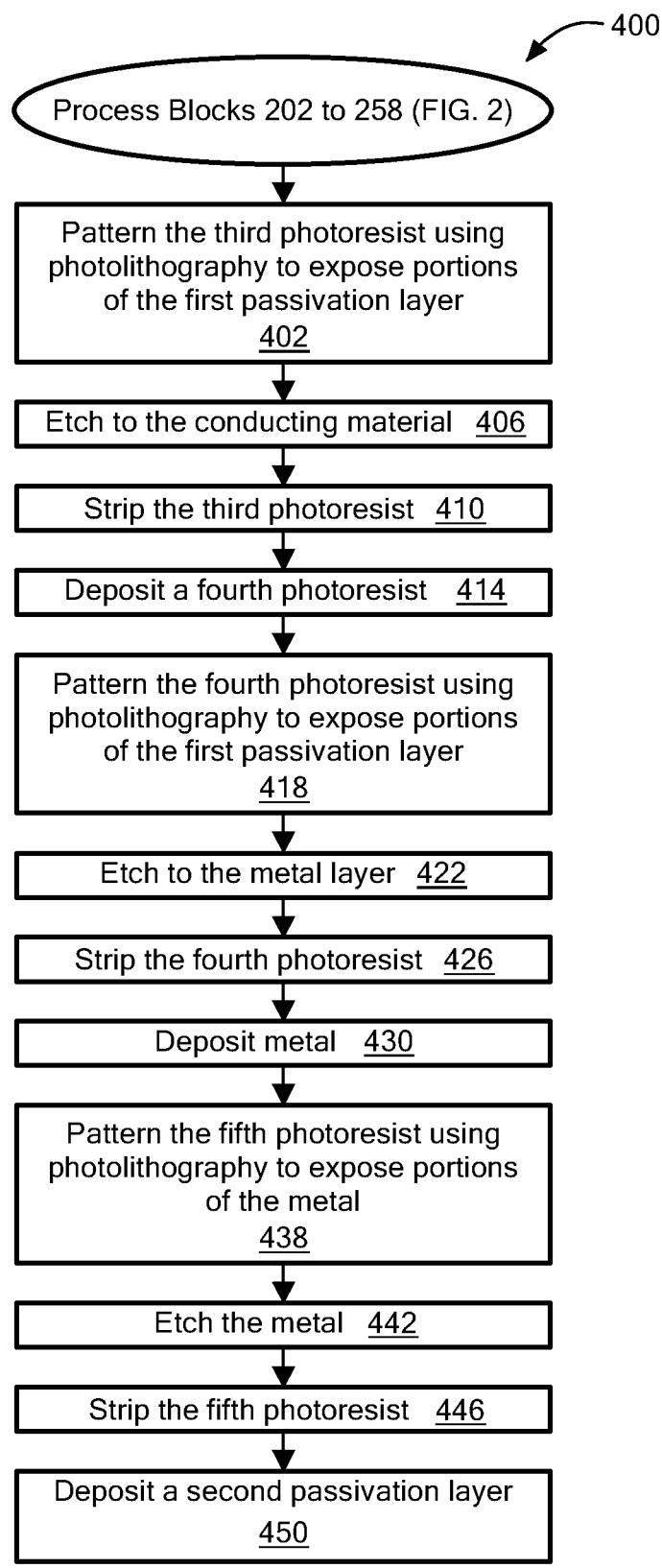
FIG. 4 is a flowchart of an example of a process to fabricate the electroconductive contact on the top surface of TMR element in FIGS. 3A to 3J.

Referring to FIG. 4, another example of a process to fabricate an electroconductive contact on a top surface of a TMR element is a process 400. In one example, process 400 may be used to form the device 350 (FIG. 3J).

Process 400 performs the processing blocks 202, 206, 210, 214, 218, 222, 226, 230, 234, 238, 242, 246, 250, 254, 258 (FIG. 2). Process 400 patterns the third photoresist using photolithography to expose portions of the passivation layer (402) and etches the exposed portions of the passivation layer (406). For example, the third photoresist 109 is patterned using standard photolithographic techniques to expose portions of the passivation layer 108 and the exposed portions of the first passivation layer 108 are etched down to the conducting material (FIG. 3A).

Process 400 strips the third photoresist (410). For example, the third photoresist 109 is removed using standard photoresist stripping techniques (FIG. 3B).

Process 400 deposits a fourth photoresist (414) and patterns the fourth photoresist using photolithography to expose portions of the first passivation layer (418). For example, the fourth photoresist 301 is patterned using standard photolithographic techniques to expose portions of the first passivation layer 108 (FIG. 3C).

Process 400 etches to the metal layer (422). For example, the exposed portions of the passivation layer 108 are etched down to the metal layer 102 using standard etching techniques (FIG. 3D).

Process 400 strips the fourth photoresist (426). For example, the fourth photoresist 301 is removed using standard photoresist stripping techniques (FIG. 3E).

Process 400 deposits a metal (430). For example, the metal 302 is deposited directly on the metal layer 102 and the conducting material 106 using standard deposition techniques (FIG. 3F).

Process 400 deposits a fifth photoresist (434) and patterns the fifth photoresist using photolithography to expose portions of the metal (438). For example, the fifth photoresist 303 is patterned using standard photolithographic techniques to expose portions of the metal 302 (FIG. 3G).

Process 400 etches to the metal (442). For example, the exposed portions of the metal 302 are etched using standard etching techniques (FIG. 3H).

Process 400 strips the fifth photoresist (446). For example, the fifth photoresist 303 is removed using standard photoresist stripping techniques (FIG. 3I).

Process 400 deposits a second passivation layer (278). For example, the passivation layer 304 is deposited on the metal 302 using standard deposition techniques (FIG. 3J).

FIGS. 5A to 5D depict further example to fabricate an electroconductive contact on a top surface of a TMR element. In one example, the process begins with the intermediate device 130 (FIG. 1J), and a second insulator 502 is deposited on the conducting material 106. In some examples, the conducting material 106 may be thicker (e.g., 200 nm to 4000 nm).

The second insulator 502 is etched back. The conducting material and the insulator are planarized to form an intermediate device 540.

A passivation layer 504 is deposited on the planarized second insulator 502 and the planarized conducting material 106. In some examples, the passivation layer 504 may be silicon dioxide, silicon nitride and so forth.

Figure 5A:
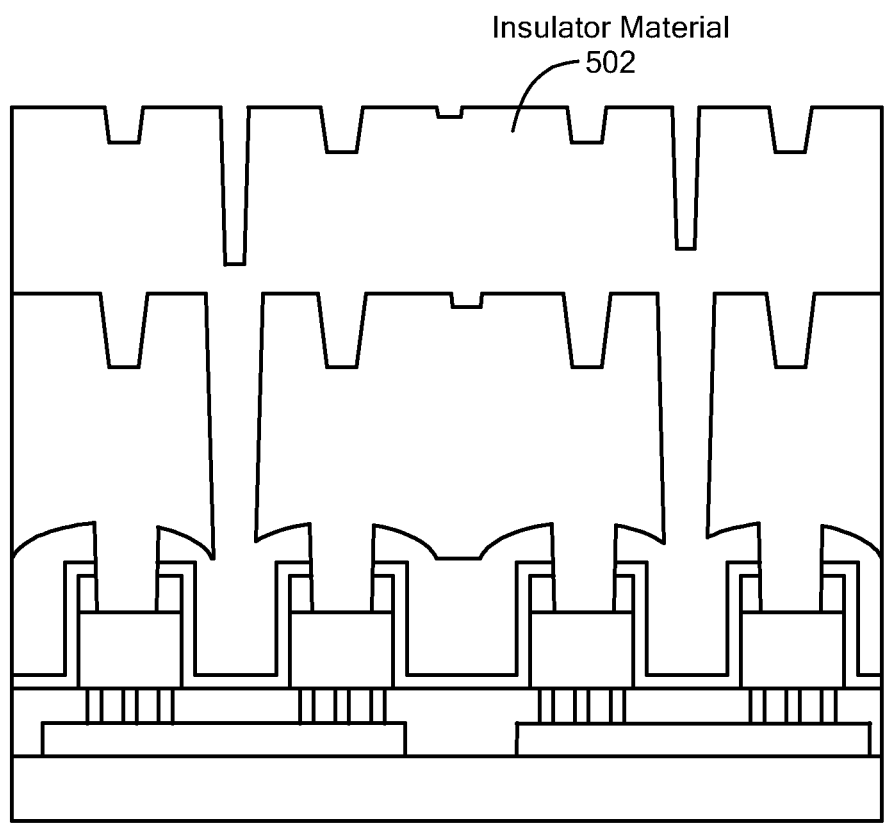
FIGS. 5A to 5D are diagrams of a further example to fabricate an electroconductive contact on a top surface of the TMR element.
Figure 5B:
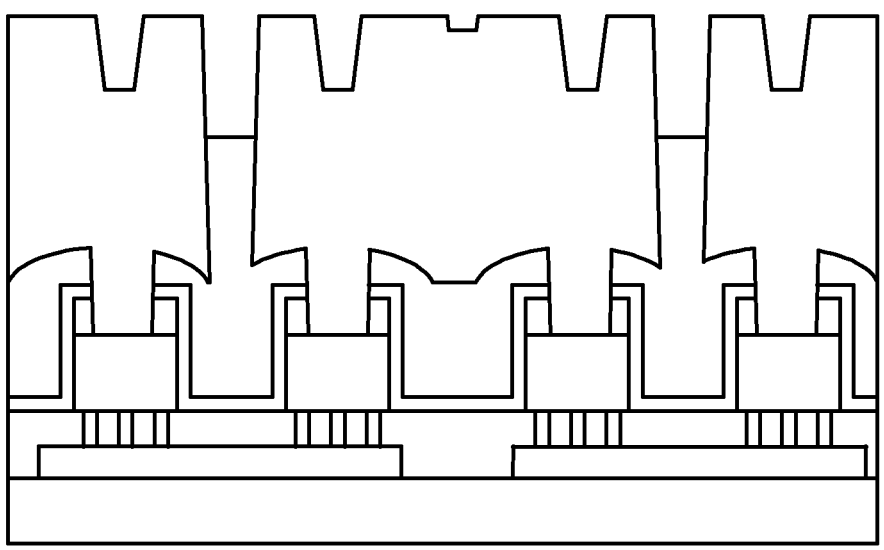
Figure 6:
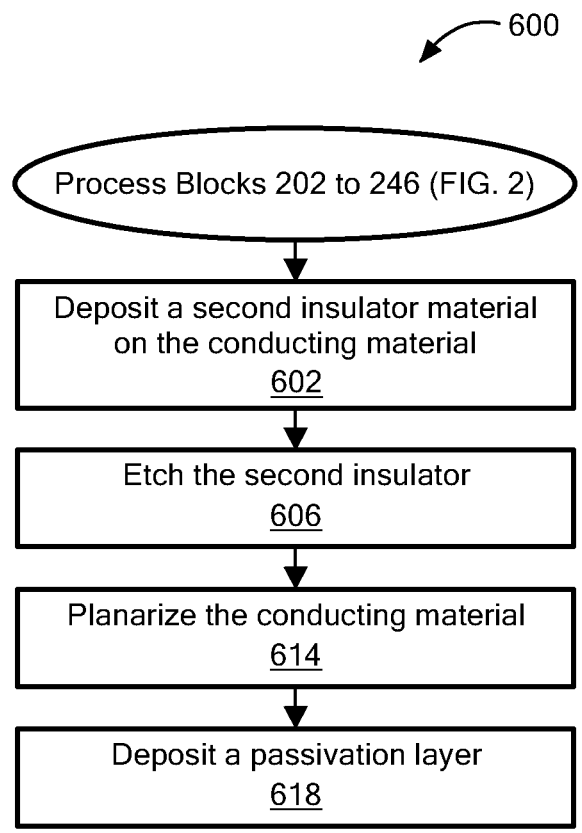
FIG. 6 is a flowchart of an example of a process to fabricate the electroconductive contact on the top surface of TMR element in FIGS. 5A to 5D.

Referring to FIG. 6 process 600 performs the processing blocks 202, 206, 210, 214, 218, 222, 226, 230, 234, 238, 242, 246 (FIG. 2). Process 600 deposits a second insulator on the conducting material (602). For example, the second insulator 502 is deposited on the conducting material 106 and the insulator 104 using a standard low temperature (e.g., less than 200° C.) oxide deposition (FIG. 5B).

Process 600 etches the second insulator (606). For example, the second insulator 502 may be dry etched (FIG. 5B).

Figure 5C:
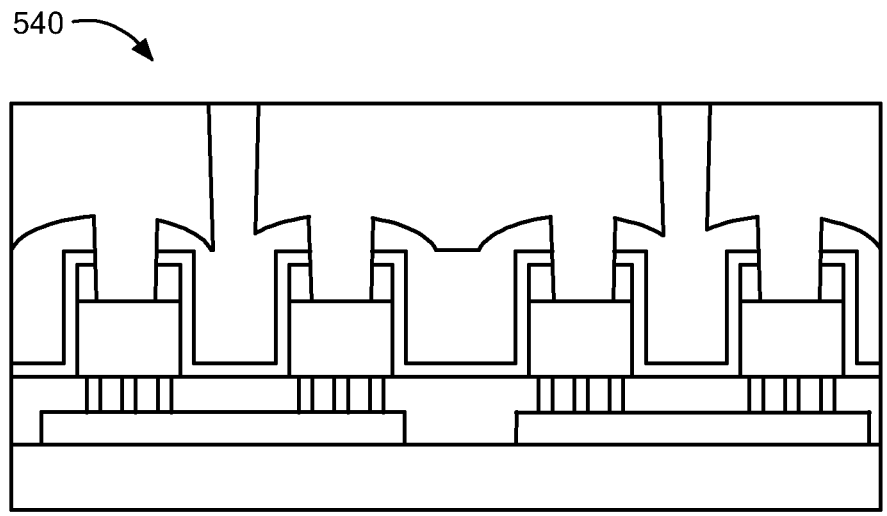

Process 600 performs planarization on the conducting material and the second insulator (614). For example, the conducting material 106 and the second insulator 502 are planarized using CMP techniques (FIG. 5C).

Figure 5D:
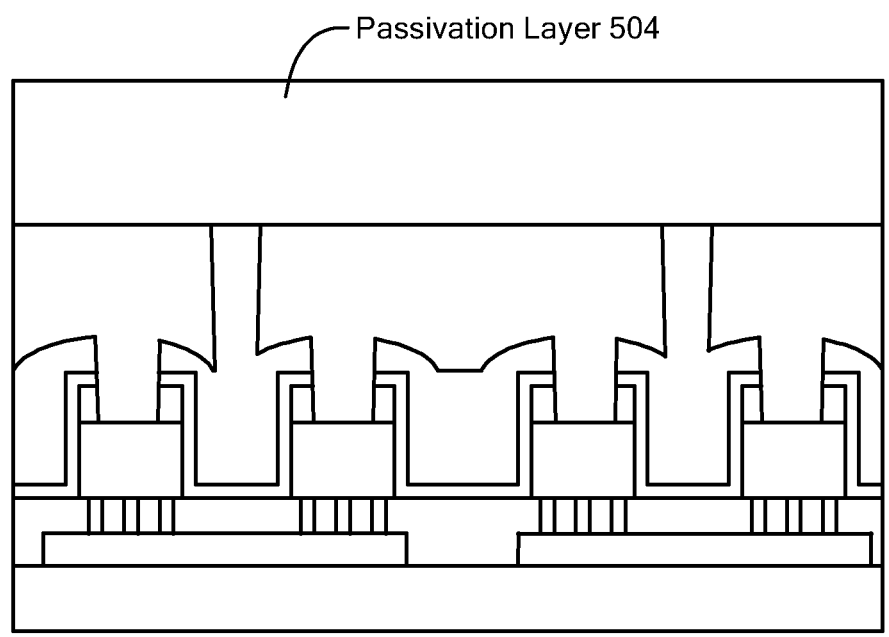

Process 600 deposits a passivation layer (618). For example, the passivation layer 504 is deposited on the conducting material 106 and the second insulator 502 using standard deposition techniques (FIG. 5D).

Figure 7A:
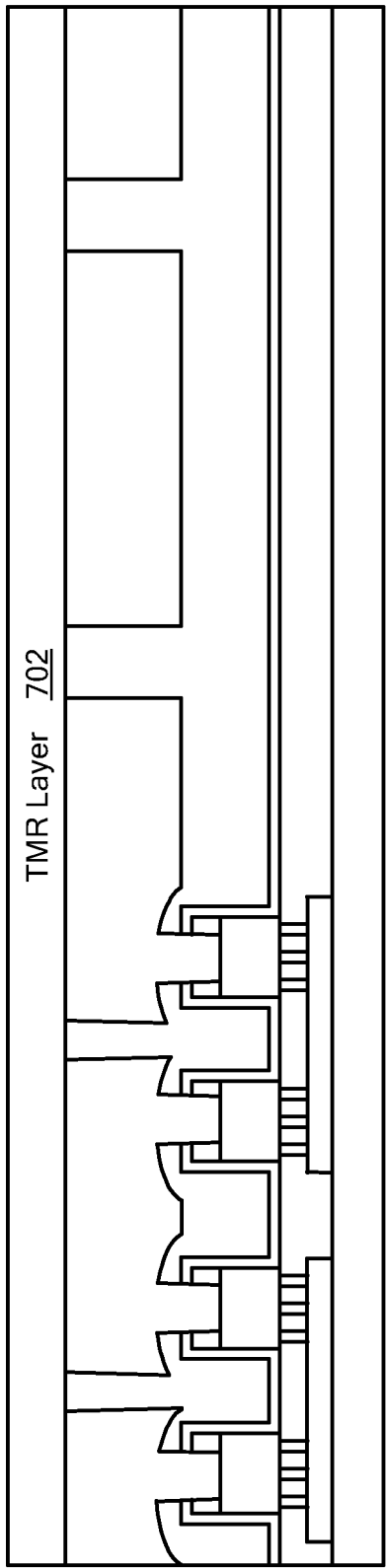
FIGS. 7A to 7Q are diagrams of a still further example to fabricate an electroconductive contact on a top surface of the TMR element.
Figure 7B:
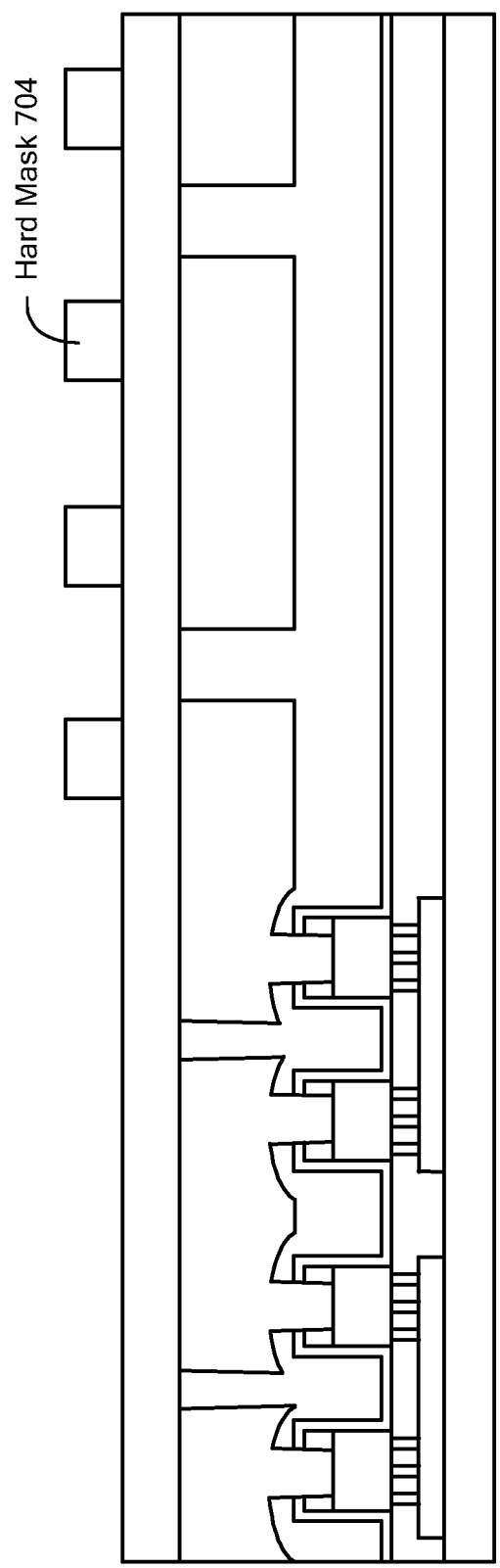
Figure 7C:
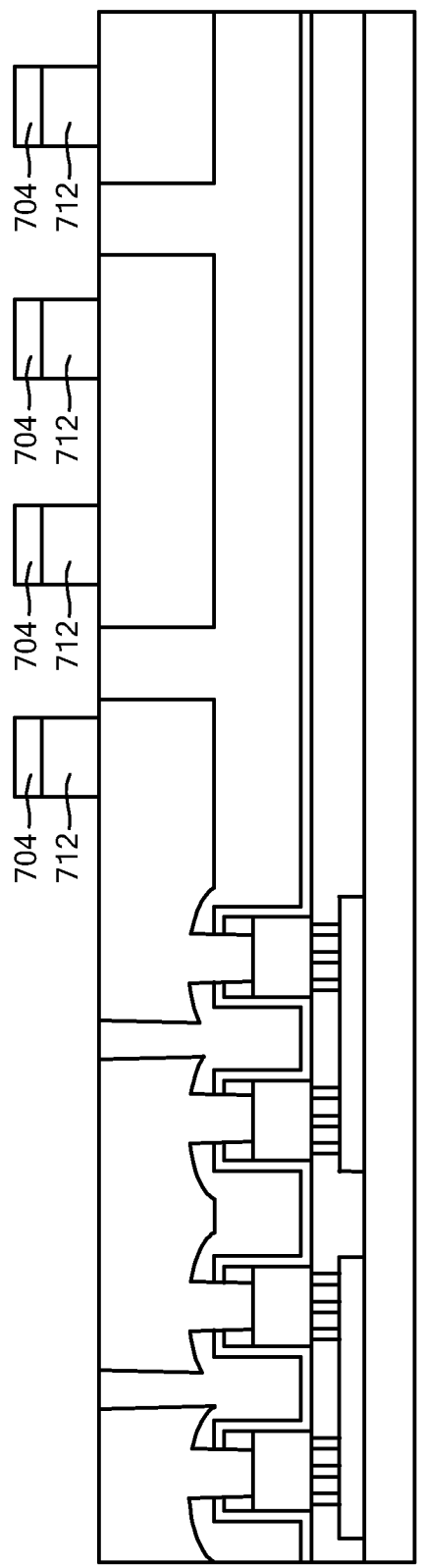
Figure 7D:
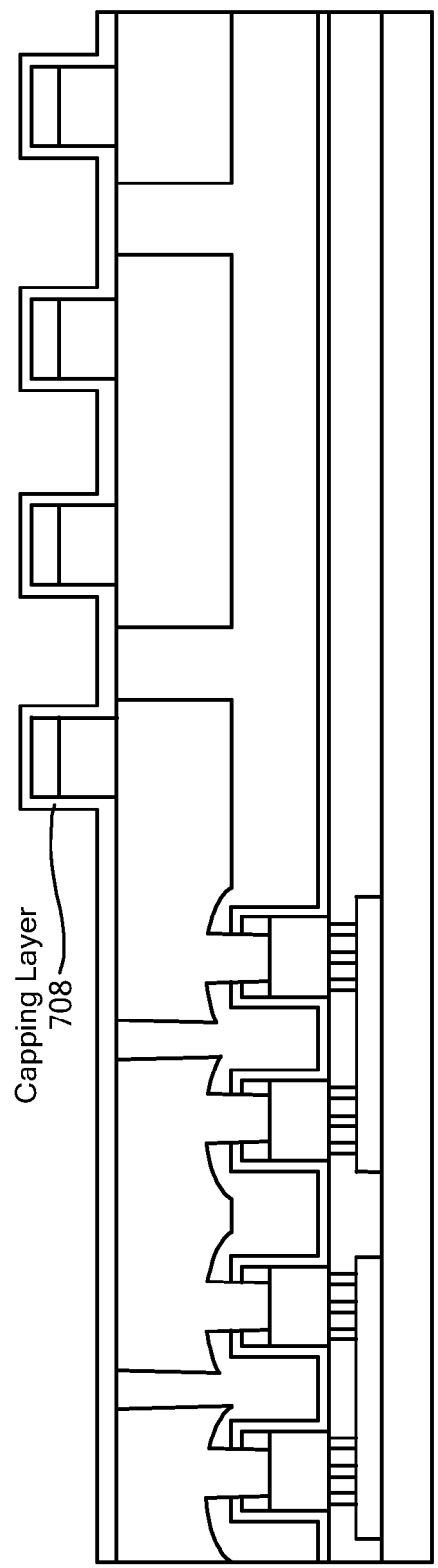
Figure 7G:
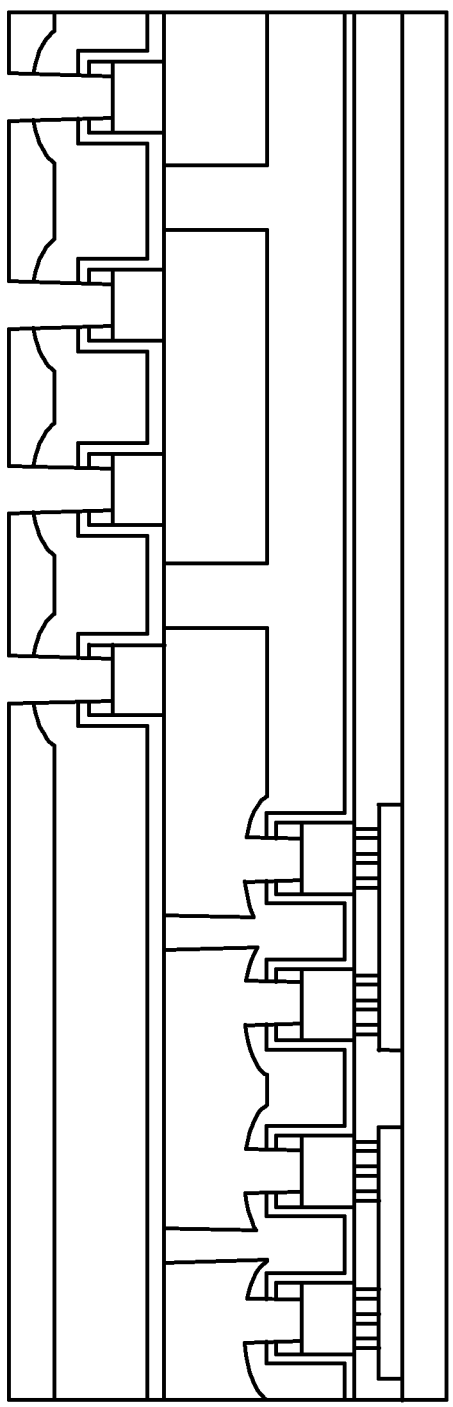
Figure 7H:
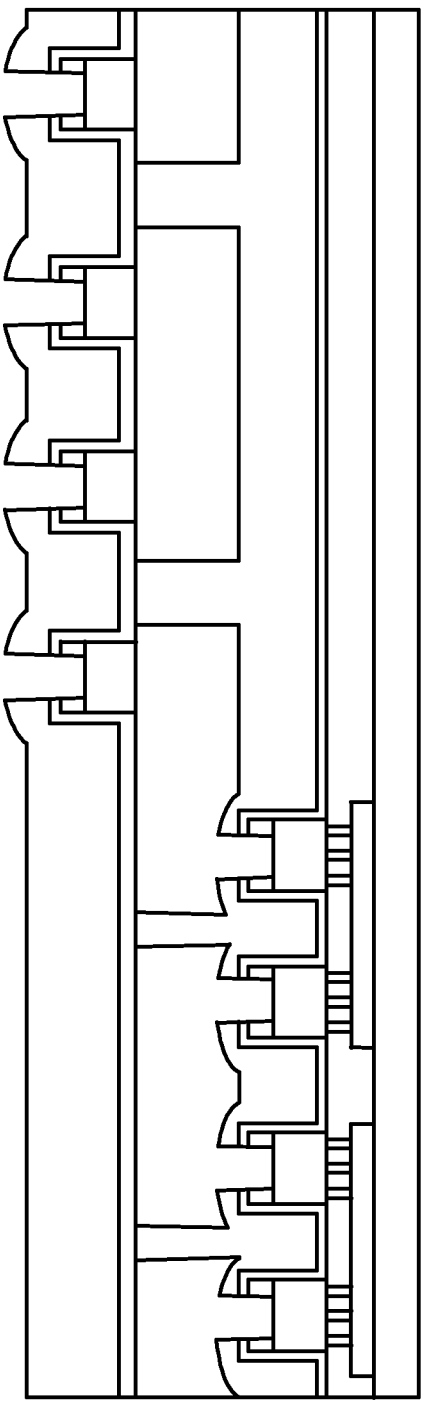
Figure 7I:
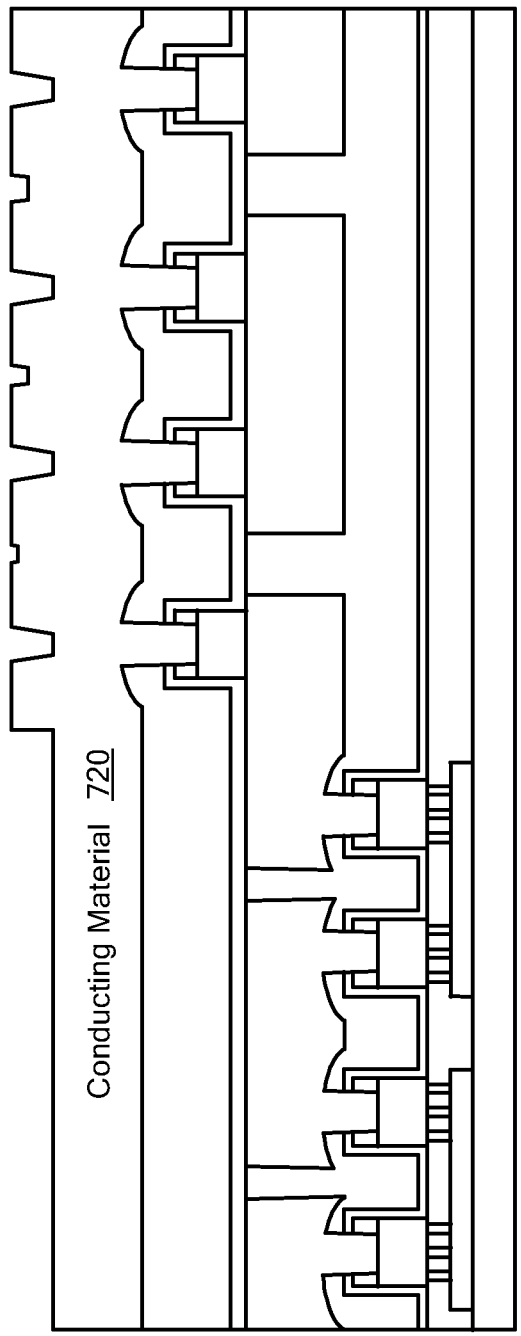
Figure 7J:
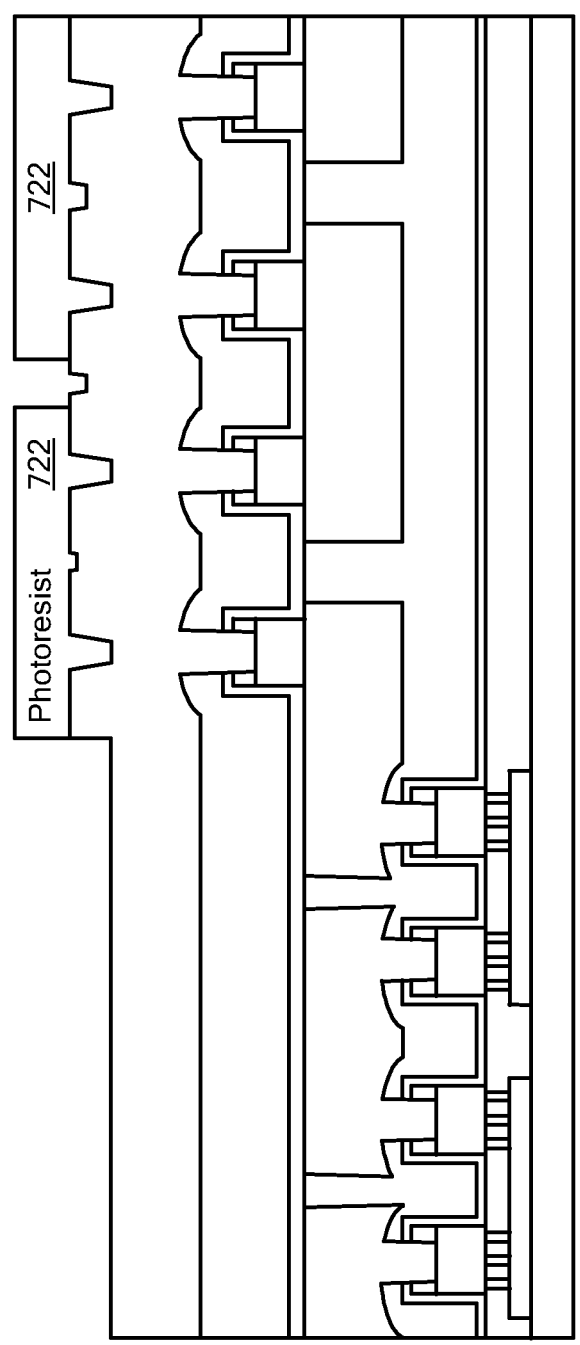
Figure 7K:
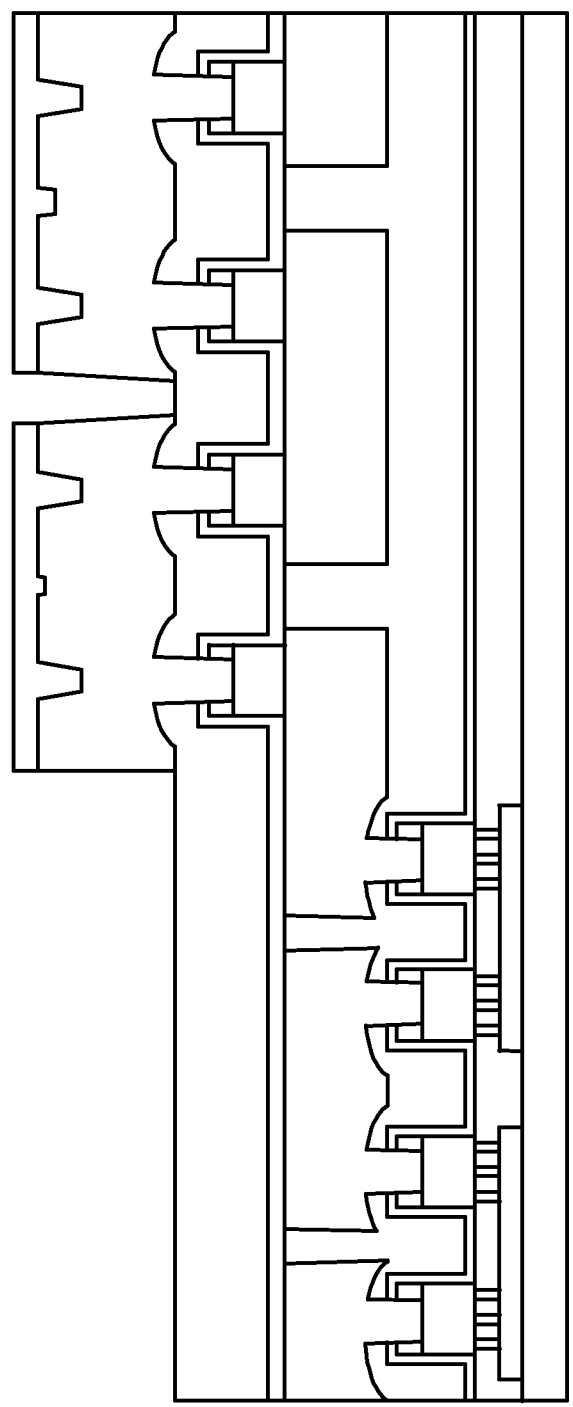
Figure 7L:
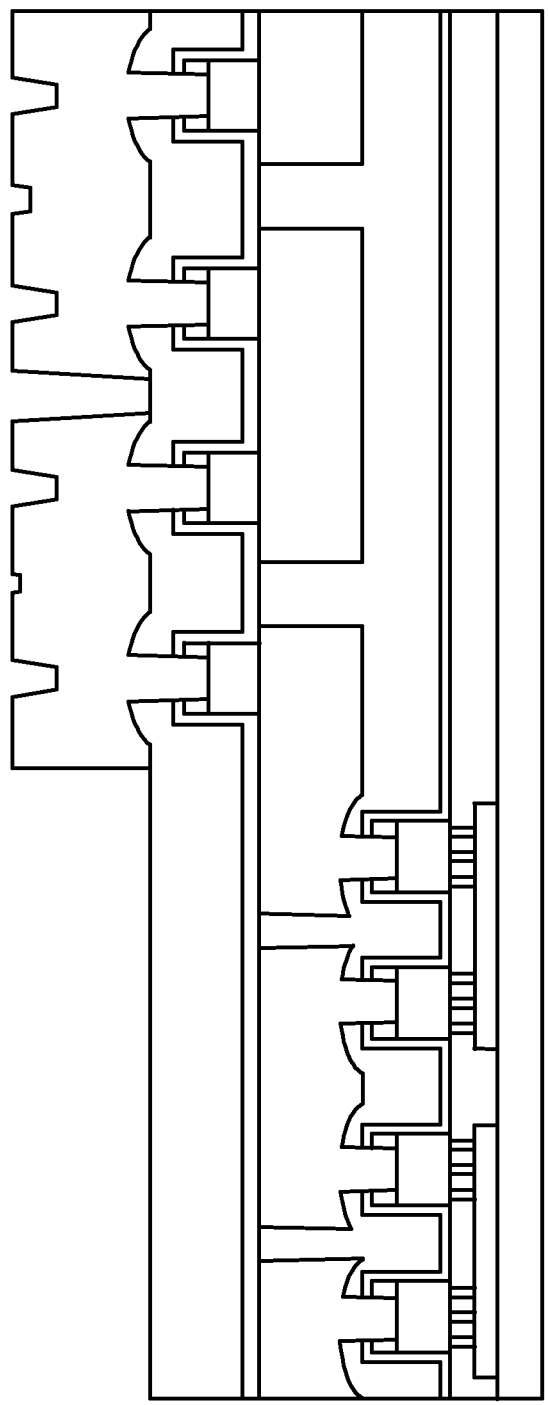
Figure 7M:
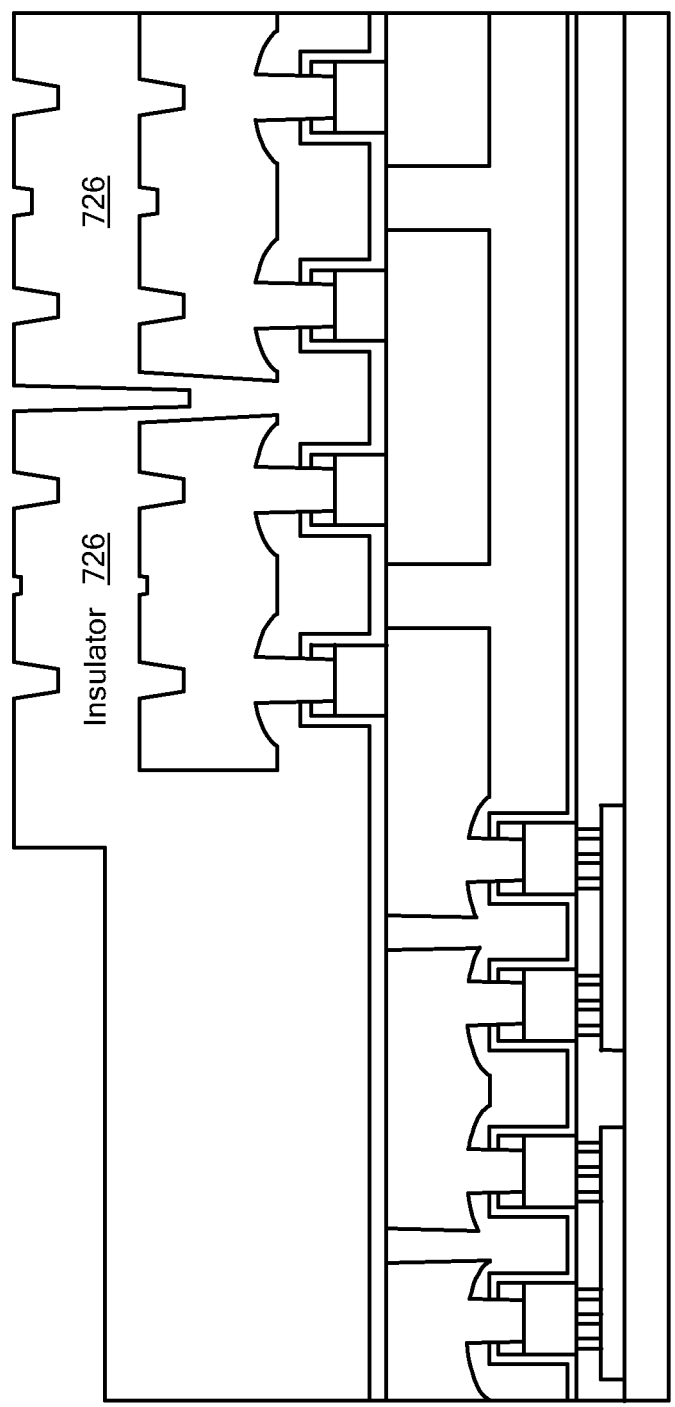
Figure 7N:
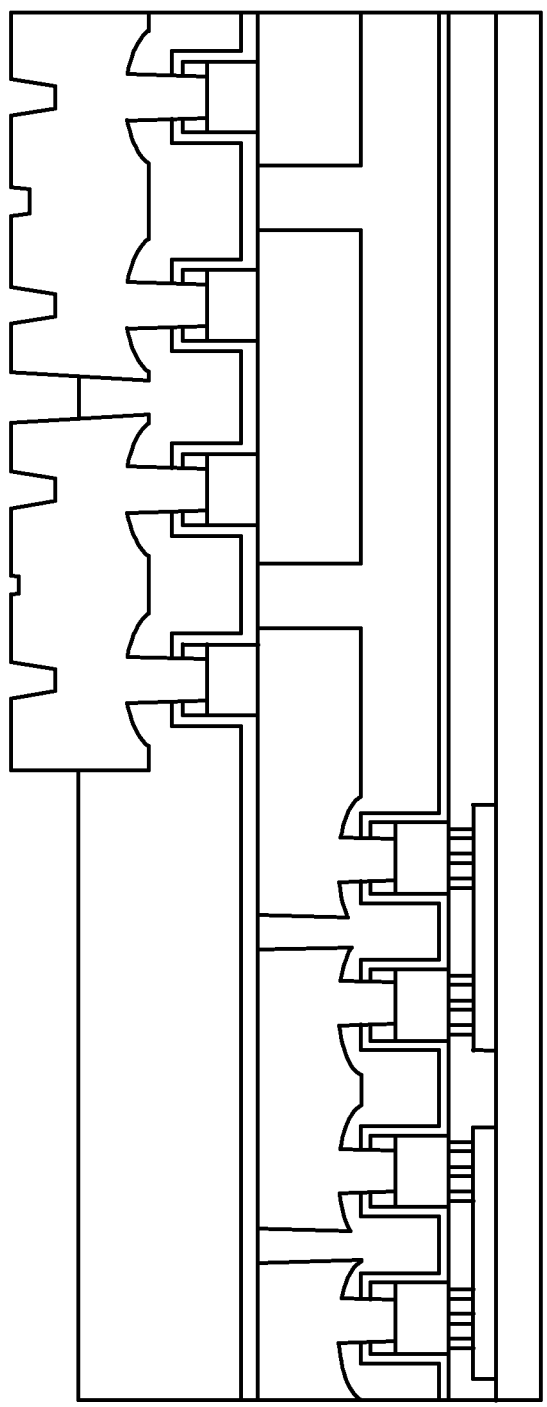
Figure 7O:
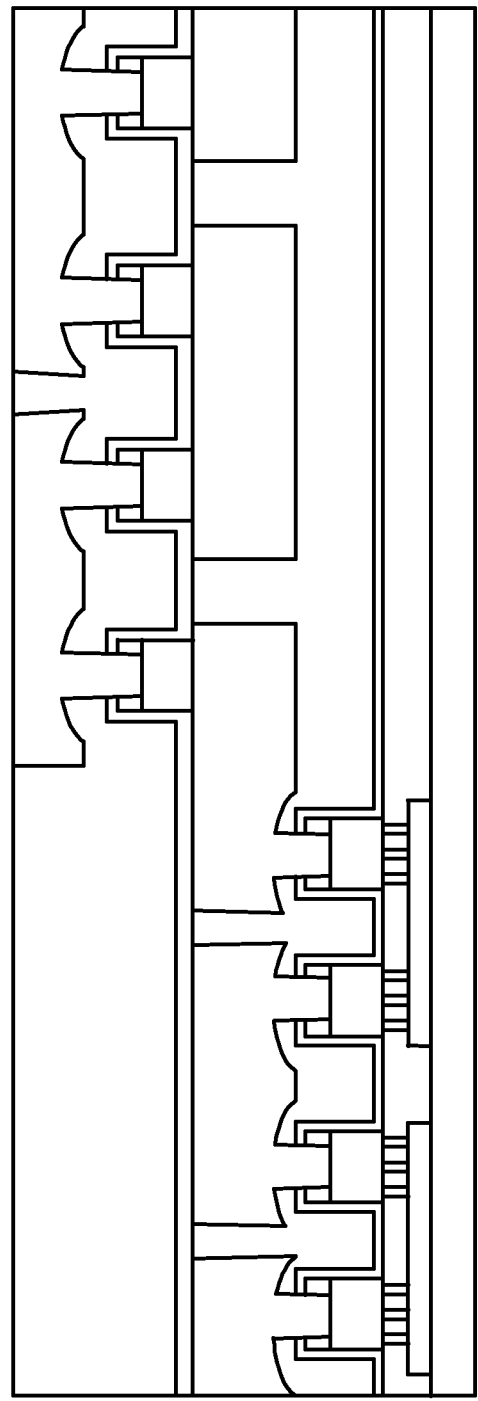
Figure 7P:
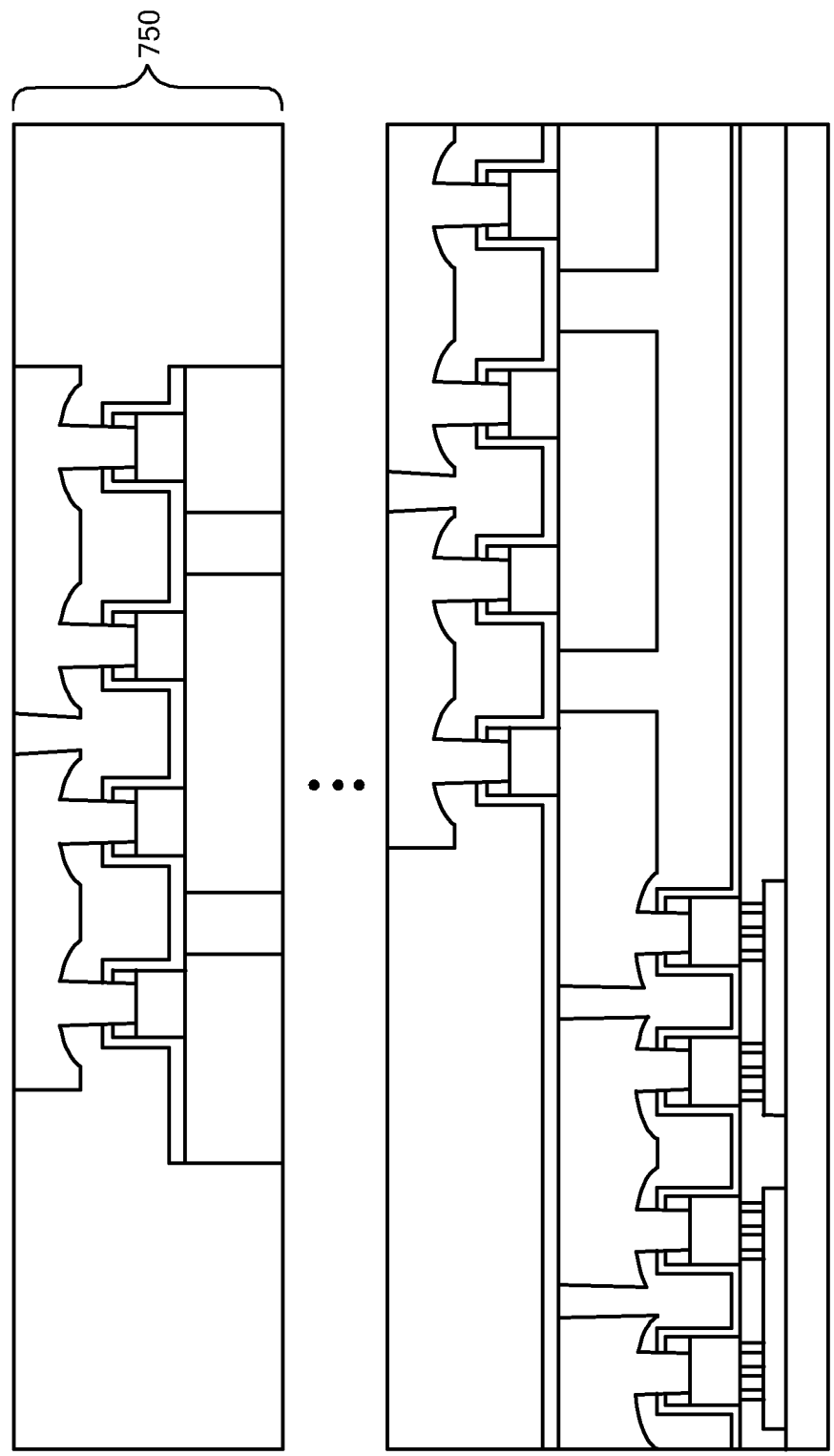
Figure 7Q:
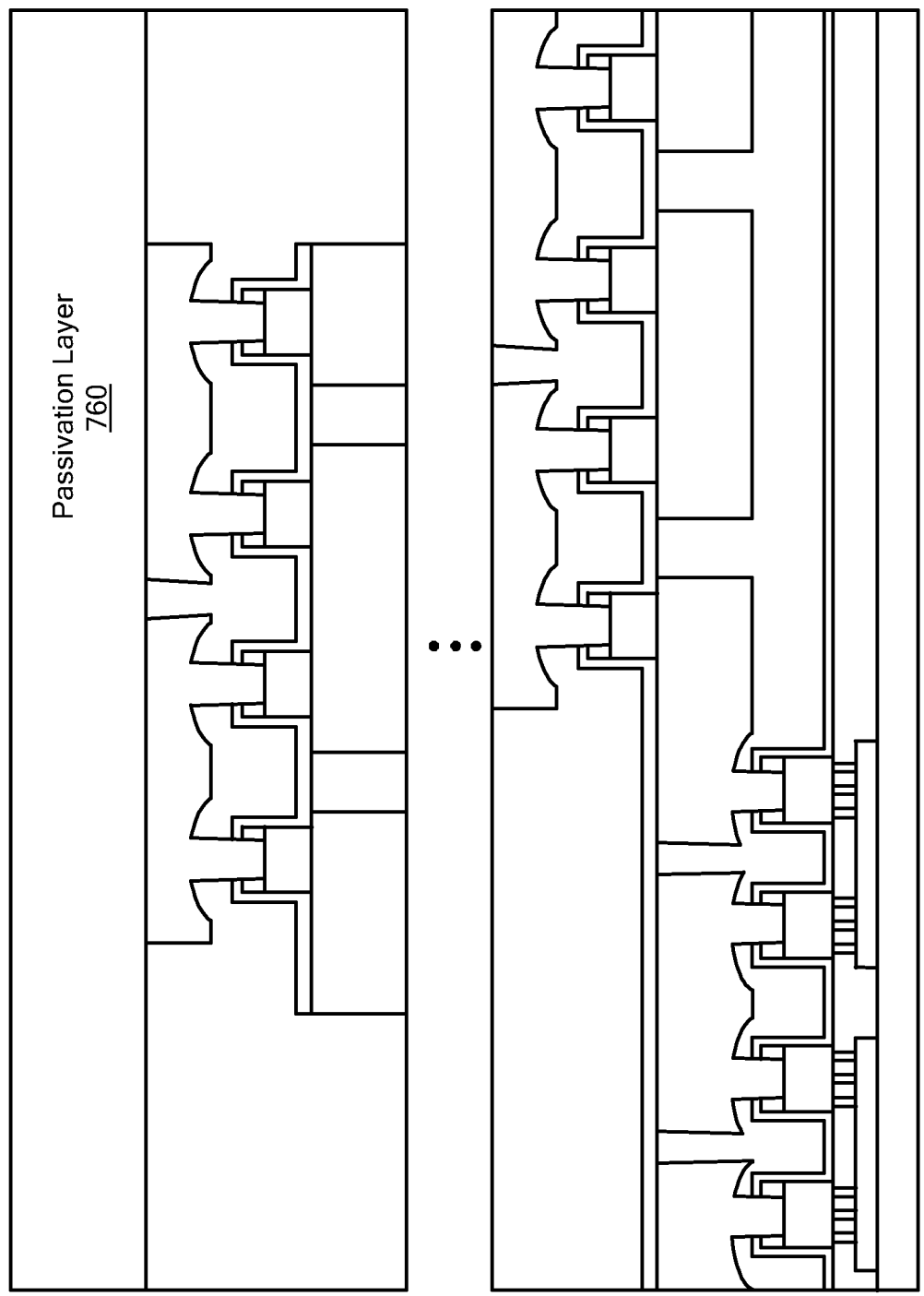

FIGS. 7A to 7Q depict a still further example to fabricate an electroconductive contact on a top surface of a TMR element. In one example, the process may begin with the intermediate device 540 (FIG. 5C), and a TMR layer 702 is deposited on the planarized insulator material 502 and the planarized conductor material 106. A hard mask layer 704 is deposited on the TMR layer 702.

A third photoresist (not shown) is deposited on the hard mask layer 704 and patterned to expose portions of the hard mask layer 704. The exposed portions of the hard mask layer 704 are etched down to the TMR layer 702 and the third photoresist (not shown) is removed.

The exposed portions of the TMR layer 702 are etched away forming a plurality of TMR elements 712. A capping layer 708 is deposited on the planarized insulator material 502, the planarized conductor material 106, the hard mask layer 704 and the side walls of the TMR elements 712. In one example, the capping layer 708 may be silicon nitride.

An insulator 714 is deposited on the capping layer 708. A photoresist 716 is deposited on the insulator 714 on the capping layer 708, and the photoresist 716 is patterned to expose portions of the insulator 714. In one example, the insulator 714 may be an oxide.

The exposed portions of the insulator 714 are etched down to and exposing the top surfaces of the TMR elements 712. After the photoresist 716 is removed, a conducting material 720 is deposited on the insulator 714 and directly in contact with the TMR elements 712. In one example, the conducting material 720 may be titanium nitride.

A photoresist 722 is deposited on the conducting material 720, and the photoresist 722 is patterned to expose portions of the conducting material 720. The exposed portions of the conducting material 720 are etched forming jumpers between two TMR elements.

After the photoresist 722 is removed, an insulator 726 is deposited. In one example, the insulator 726 may the same material as the insulator 714. In one example, the insulator 714 may be an oxide.

The insulator 726 is etched. The insulator 726 and the conducting material 720 are planarized to form a first TMR structure 750.

The processes in FIGS. 7A to 7O may be repeated multiple times as desired. After a desired number of TMR structures 750 have been formed, a passivation layer 760 is deposited. In one example, the passivation layer 760 may be silicon dioxide or silicon nitride.

Figure 8:
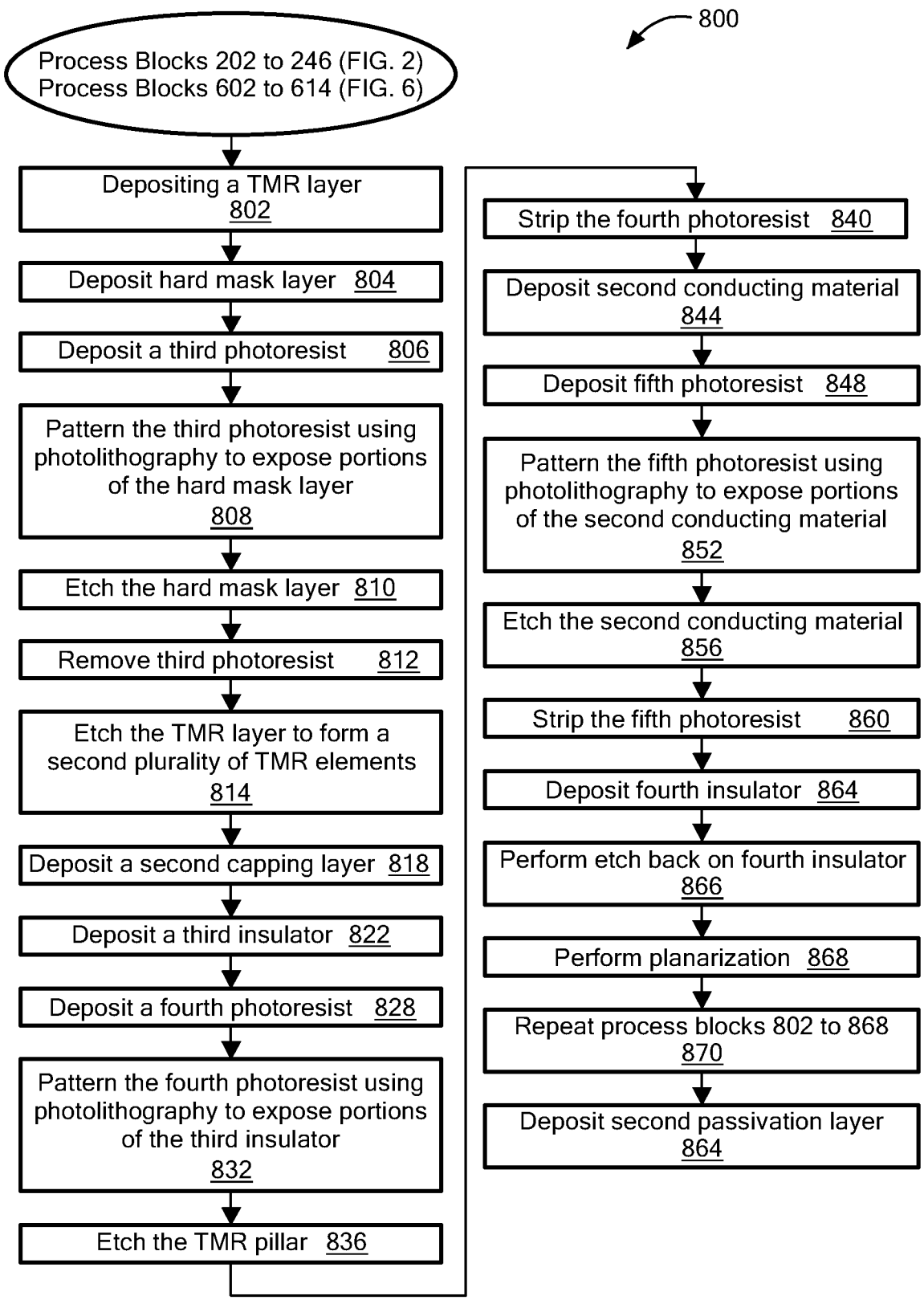
FIG. 8 is a flowchart of an example of a process to fabricate the electroconductive contact on the top surface of TMR element in FIGS. 7A to 7Q.

Referring to FIG. 8, process 800 performs the processing blocks 202, 206, 210, 214, 218, 222, 226, 230, 234, 238, 242, 246 (FIG. 2) and processing blocks 602, 606, 614 (FIG. 6). Process 800 deposits a TMR layer (802). For example, the TMR layer 702 is deposited on the intermediate device 540 (FIG. 5C) as shown in FIG. 7A.

Process 800 deposits a hard mask layer (804). For example, the hard mask layer 704 is deposited on the TMR layer 702 (FIG. 7B).

Process 800 deposits a third photoresist (806) and patterns the third photoresist using photolithography to expose portions of the hard mask layer (808). For example, the third photoresist (not shown) is deposited on the hard mask layer 704 and patterned using standard photolithographic techniques to expose portions of the hard mask layer 704.

Process 800 etches the exposed portion of the hard masks layer (804). For example, the exposed portions of the hard mask layer 704 are etched using an etching process (e.g., reactive ion etching) with the photoresist (not shown) acting as a mask (FIG. 7B).

Process 800 removes the third photoresist (not shown) (812). For example, the photoresist (not shown) is removed using standard photoresist stripping techniques (FIG. 7B).

Process 800 etches the TMR layer to form a plurality of TMR elements (814). For example, the exposed portions of the TMR layer 702 are etched using standard ion beam etching techniques (FIG. 7C).

Process 800 deposits a capping layer (818). For example, the capping layer 708 may be deposited on the hard mask layer 704, the insulator 104, and sidewalls of the TMR elements 712 using standard deposition techniques (FIG. 7D).

Process 800 deposits a third insulator (822). For example, the insulator 714 is deposited on the capping layer 708 using standard low temperature oxide deposition (FIG. 7E).

Process 800 deposits a fourth photoresist (828) and patterns the fourth photoresist using photolithography to expose portions of the third insulator (832). For example, the photoresist 716 is deposited and patterned using standard photolithographic techniques to expose portions of the insulator 714 (FIG. 7F).

Process 800 etches to the TMR element (836). For example, the exposed portions of the insulator 714 are etched using standard etching techniques to expose top surfaces of the TMR elements (FIG. 7G).

Process 800 strips the fourth photoresist (840). For example, the photoresist 716 is removed using standard photoresist stripping techniques (FIG. 7H).

Process 800 deposits second conducting material (844). A conducting material 720 is deposited on the insulator 714 and on top surfaces of the TMR elements 712 to form electroconductive contacts. In one example, the conducting material 720 may be titanium nitride (FIG. 7I).

Process 800 deposits a fifth photoresist (848) and patterns the fifth photoresist using photolithography to expose portions of the second conducting material (852). For example, the photoresist 722 is deposited and patterned using standard photolithographic techniques to expose portions of the conducting material 720 (FIG. 7J).

Process 800 etches the second conducting material (856). For example, the exposed portions of the conducting material 720 are etched away using standard etching techniques (FIG. 7K).

Process 800 strips the fifth photoresist (860). For example, the photoresist 722 is removed using standard photoresist stripping techniques (FIG. 7L).

Process 800 deposits a fourth insulator (864). For example, the insulator 726 is deposited on the conducting material 720 and the insulator 714 using a standard low temperature oxide deposition (FIG. 7M).

Process 800 performs etch back on the fourth insulator (866). For example, the insulator 726 are etched using standard etching techniques to expose top surfaces of the TMR elements (FIG. 7N).

Process 800 performs planarization (868). For example, the insulator 726 and the conducting material 720 are planarized using CMP techniques (FIG. 7O).

Process 800 may repeat process blocks 802, 804, 806, 808, 810, 812, 814, 818, 822, 828, 832, 836, 840, 844, 848, 852, 856, 860, 864, 866, 868 to form the desired number of TMR structures 750 (FIG. 7P).

Process 800 deposits second passivation layer (876). For example, the passivation layer 760 is deposited on the topmost TMR structure 750 using standard deposition techniques (FIG. 7Q).

Figure 9A:
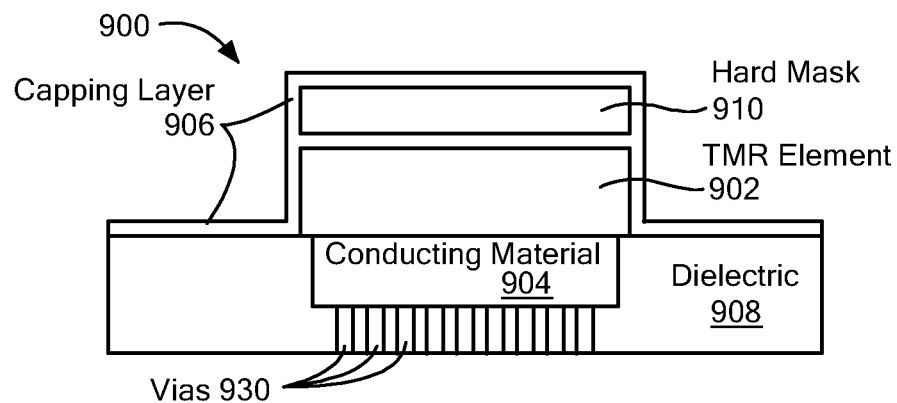
FIGS. 9A to 9I are diagrams of an example to fabricate an electroconductive contact on a top surface of a TMR element having a diameter less than one micron.

FIGS. 9A to 9I depict an example to fabricate an electroconductive contact on a top surface of a TMR element having a diameter less than one micron. In one example, the process may start with a structure 900. The structure 900 may include a TMR element 902, a conductor material 904, a dielectric 908 and a hard mask 910. A capping layer 906 cover the dielectric 908 sidewalls of the TMR element 902 and the hard mask 910. Electroconductive vias 930 connect at one end to the conductor material 904, which connects to the bottom of the TMR element 902. The other end of the vias 930 may connected to a semiconductor device (FIG. 9A).

An insulator 922 is deposited on the capping layer 906. In one example, the capping layer 906 may be silicon dioxide. A photoresist 924 is deposited, and the photoresist 924 is patterned to expose portions of the insulator 922. The exposed portions of the insulator 922 are etched away.

After the photoresist 924 is removed, a photoresist 928 is deposited and patterned to expose a portion of the capping layer 906 that is above a top surface of the TMR element 902. The exposed portions of the capping layer 906 are etched as well as the hard mask 910 underneath exposing a portion of a top surface of the TMR element 902. Two portions 950a, 950b of the hard mask 910 remain. After the photoresist 928 is removed, a metal 930 is deposited in direct electroconductive contact with the exposed portion of the top surface of the TMR element 902, the portions 950a, 950b and the insulator 922. In one example, the metal 930 may be aluminum or copper. The portions 950a, 950b enable the metal to completely cover the exposed portion of top surface of the TMR element 902.

Figure 9B:
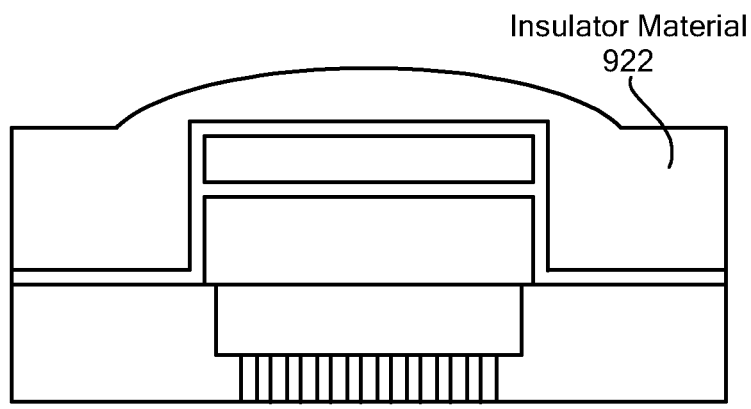

Process 1000 is one example of a process to fabricate an electroconductive contact on a top surface of a TMR element having a diameter less than one micron. Process 1000 deposits an insulator (1002). For example, the insulator 922 is deposited using standard low temperature oxide deposition techniques (FIG. 9B).

Figure 9C:
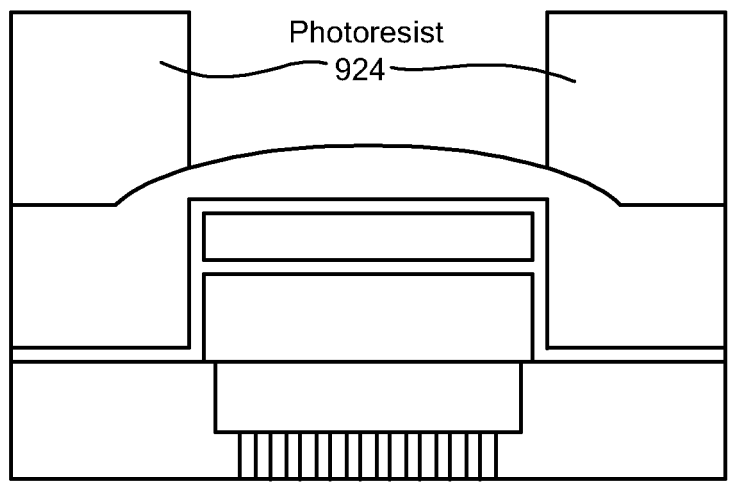

Process 1000 deposits a first photoresist (1006) and patterns the first photoresist using photolithography to expose portions of the insulator (1010). For example, the photoresist 924 is deposited and patterned using standard photolithographic techniques to expose portions of the insulator 922 (FIG. 9C).

Figure 9D:
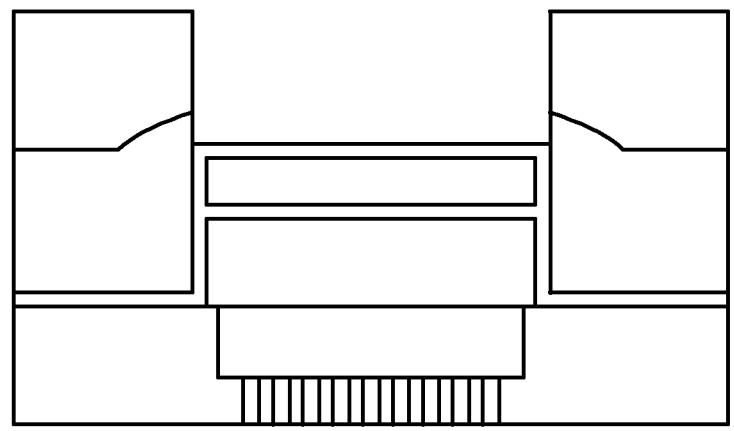

Process 1000 etches the insulator (1014). For example, the insulator 922 is etched using standard etching techniques to expose a portion of the capping layer 906 (FIG. 9D).

Figure 9E:
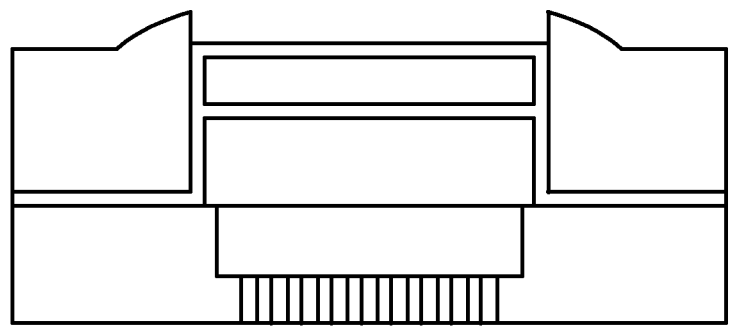

Process 1000 strips the first photoresist (1018). For example, the photoresist 924 is removed using standard photoresist stripping techniques (FIG. 9E).

Figure 9F:
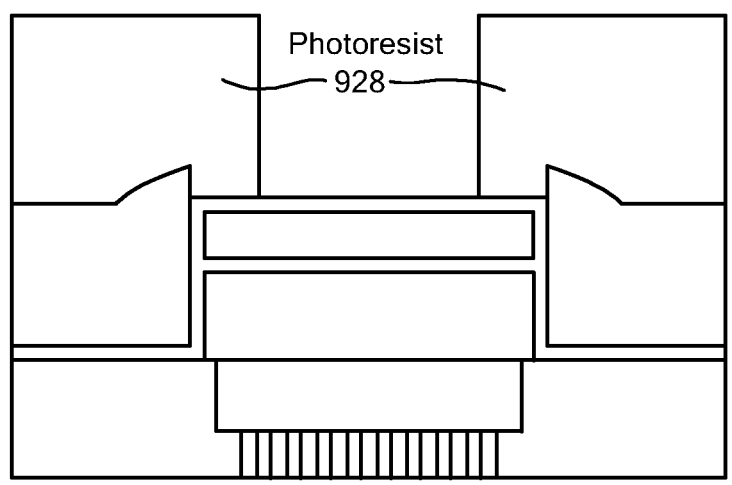

Process 1000 deposits a second photoresist (1022) and patterns the second photoresist using photolithography to expose portions of a capping layer (1026). For example, the photoresist 928 is deposited and patterned using standard photolithographic techniques to expose portions of the capping layer 906 (FIG. 9F).

Figure 9G:
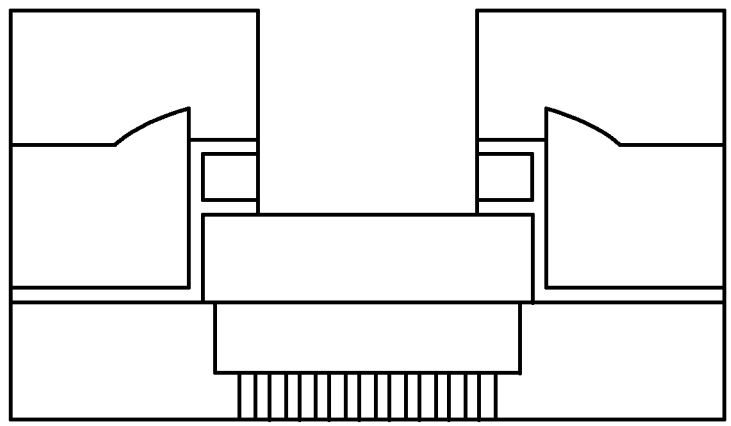

Process 1000 etches the capping layer (1028). For example, the exposed portions of the capping layer 906 along with the hard mask 910 underneath are etched down to and exposes a top surface of the TMR element 902 (FIG. 9G).

Figure 9H:
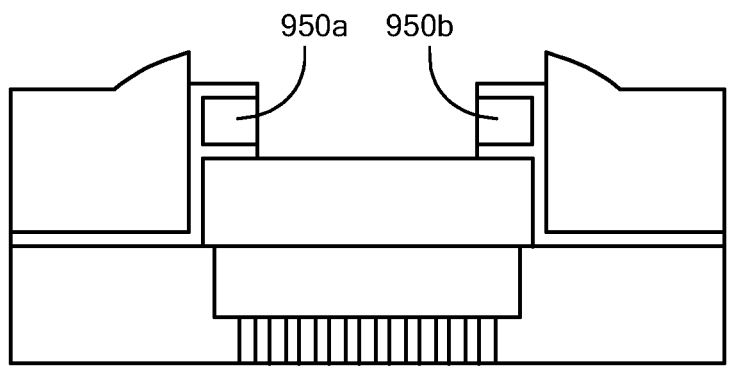

Process 1000 strips the second photoresist (1030). For example, the photoresist 928 is removed using standard photoresist stripping techniques (FIG. 9H).

Figure 9I:
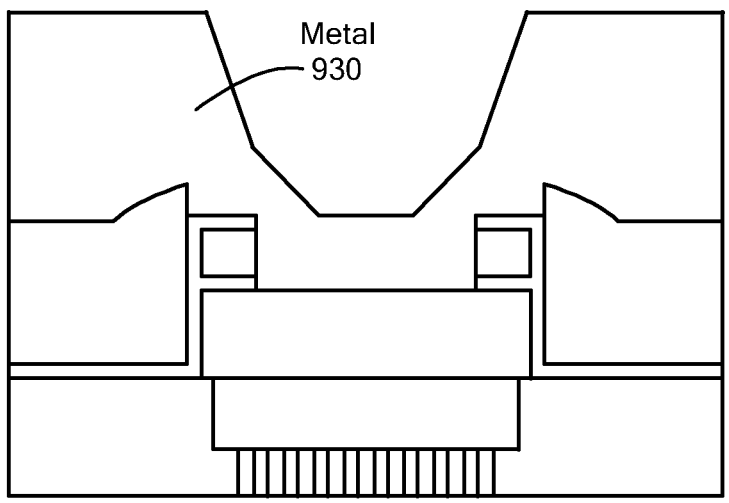
Figure 10:
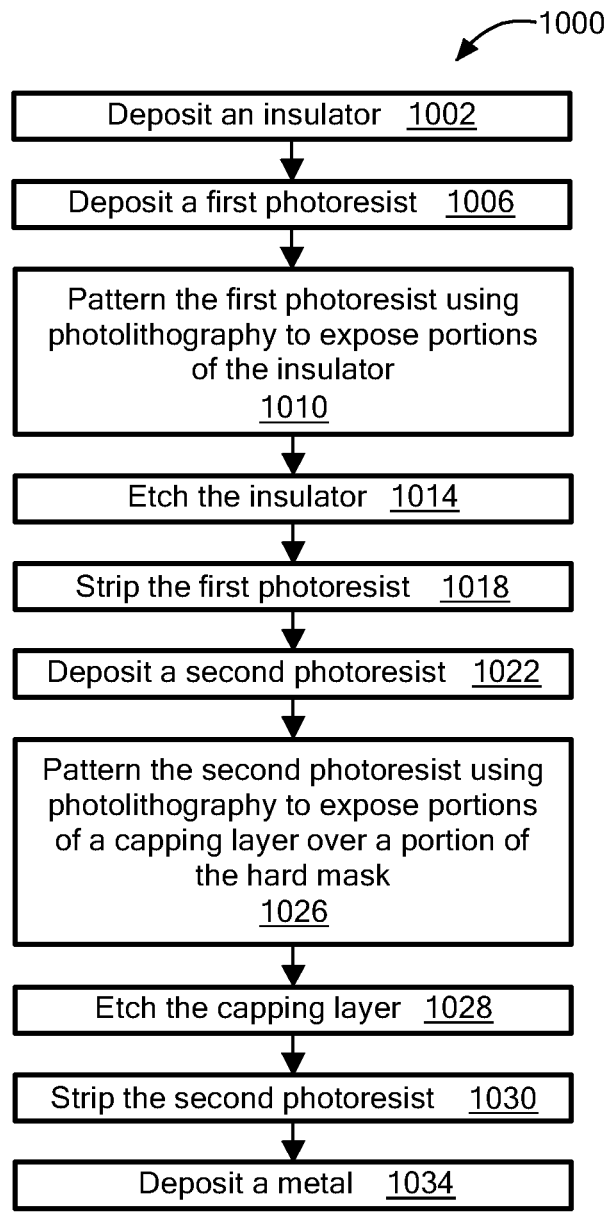
FIG. 10 is a flowchart of an example of a process to fabricate the electroconductive contact on the top surface of TMR element in FIGS. 9A to 9I.

Process 1000 deposits a metal (1034). The metal 930 is deposited on the top surface of the TMR element 902, the portions 950a, 950b and the insulator 922 using standard metal deposition techniques (FIG. 9I).

FIGS. 11A to 11E depicts another example to fabricate an electroconductive contact on a top surface of a TMR element having a diameter less than one micron. In one example, the process may start with the structure 900 (FIG. 9A).

An insulator 1102 is deposited on the capping layer 906. A photoresist 1104 is deposited, and the photoresist 1104 is patterned to expose portions of the insulator 1102. The exposed portions of the insulator 1102 are etched away along with the hard mask 910 exposing the entire top surface of the TMR element 902. After the photoresist 1104 is removed, a metal layer 1106 is deposited in direct electroconductive contact with the entire top surface of the TMR element 902. In one example, the metal 930 may be aluminum or copper.

Figure 11A:
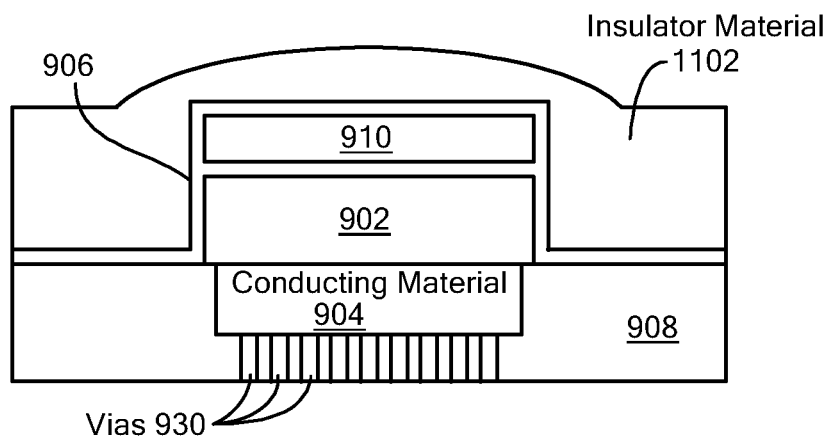
FIGS. 11A to 11E are diagrams of another example to fabricate an electroconductive contact on a top surface of a TMR element having a diameter less than one micron.

Process 1200 is another example of a process to fabricate an electroconductive contact on a top surface of a TMR element having a diameter less than one micron. Process 1200 deposits an insulator (1202). For example, the insulator 1102 is deposited using standard low temperature oxide deposition techniques (FIG. 11A).

Figure 11B:
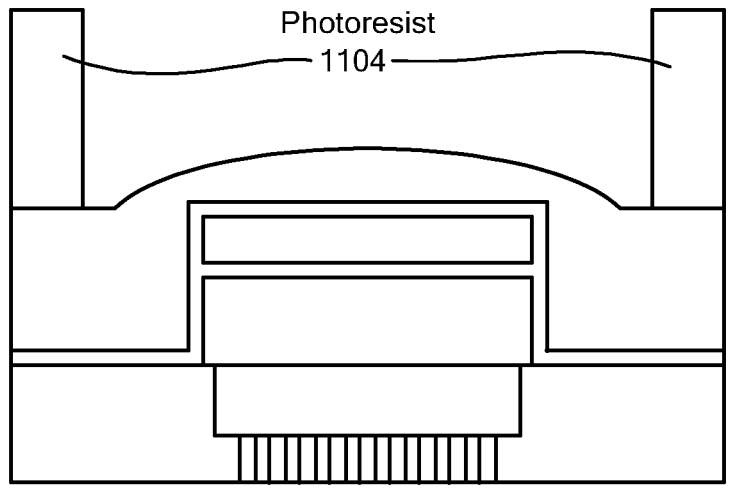
Figure 11C:
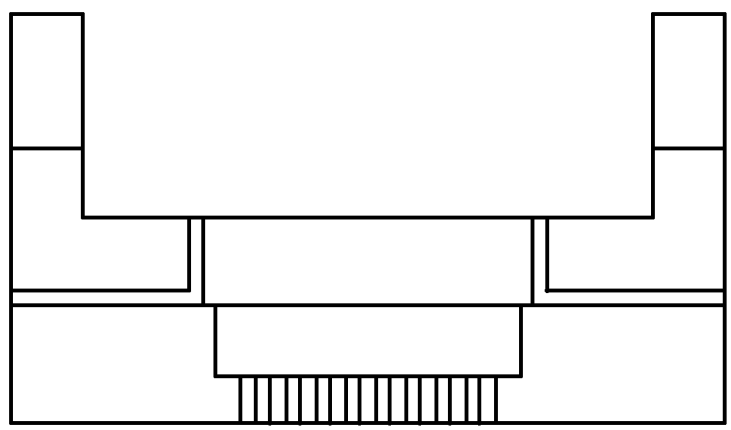

Process 1200 deposits a photoresist (1206) and patterns the photoresist using photolithography to expose portions of the insulator (1210). For example, the photoresist 928 is deposited and patterned using standard photolithographic techniques to expose portions of the insulator 1102 (FIG. 11B).

Process 1200 etches the insulator, capping layer and hard mask (1214). For example, the insulator 1102, hard mask 910 and capping layer 906 are removed using standard etching techniques thereby exposing the entire top surface of the TMR element 902.

Figure 11D:
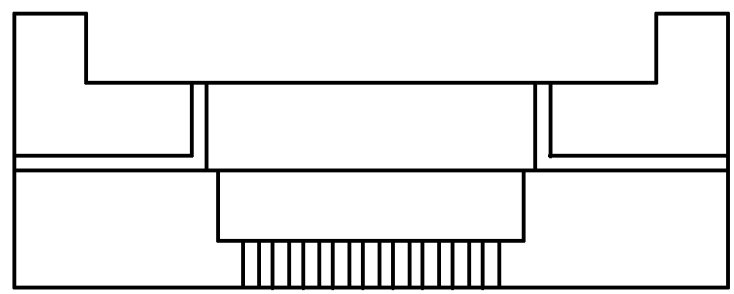

Process 1200 strips the photoresist (1218). For example, the photoresist 928 is removed using standard photoresist stripping techniques (FIG. 11D).

Figure 11E:
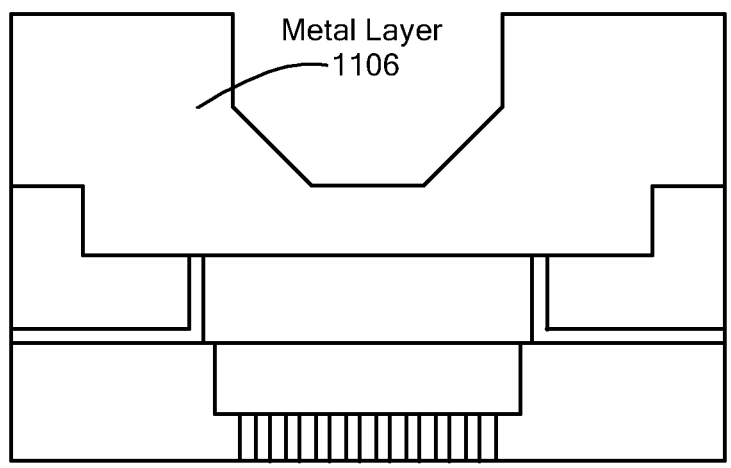
Figure 12:
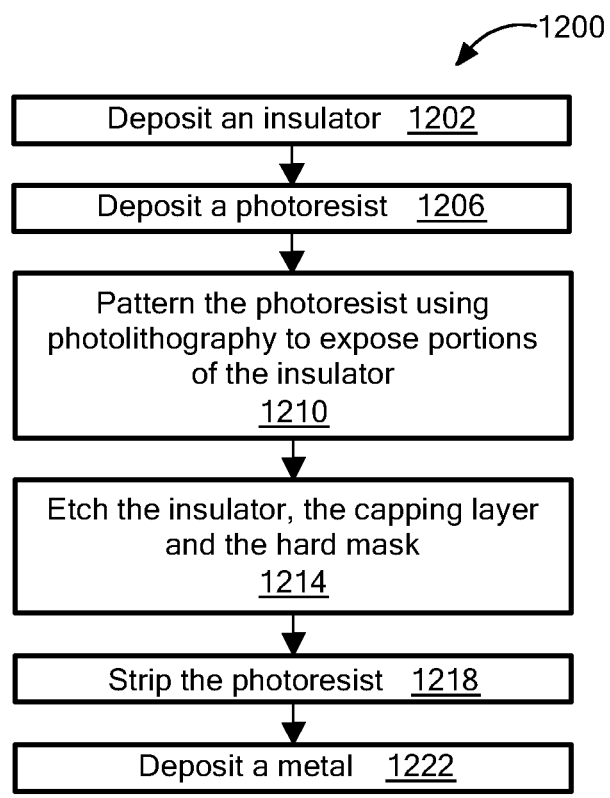
FIG. 12 is a flowchart of an example of a process to fabricate the electroconductive contact on the top surface of TMR element in FIGS. 11A to 11E.

Process 1200 deposits a metal (1222). The metal 1106 is deposited on the top surface of the TMR element 902 and the insulator 922 using standard metal deposition techniques (FIG. 11E).

FIGS. 13A to 13F depicts a further example to fabricate an electroconductive contact on a top surface of a TMR element having a diameter less than one micron. In one example, the process may start with the structure 900 (FIG. 9A).

An insulator 1301 is deposited on the capping layer 906. After the insulator is planarized, a photoresist 1302 is deposited, and the photoresist 1302 is patterned to expose portions of the insulator 1301. The exposed portions of the insulator 1102 are etched away along with the hard mask 910 exposing a portion of the top surface of the TMR element 902. Two portions 1350a, 1350b of the hard mask 910 remain.

After the photoresist 1104 is removed, a metal layer 1303 is deposited in electroconductive contact with the portion of the top surface of the TMR element 902. In one example, the metal 1303 may be aluminum or copper. The portions 1350a, 1350b enable the metal to completely cover exposed portion of the top surface of the TMR element 902.

Figure 13A:
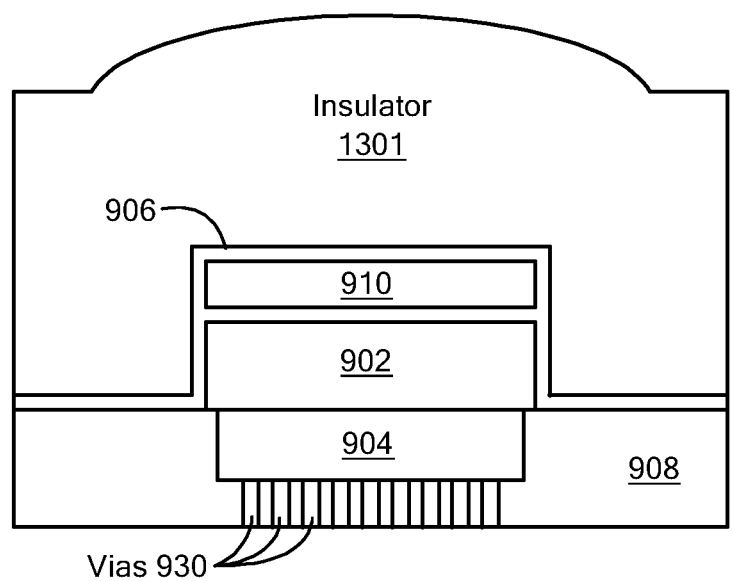
FIGS. 13A to 13F are diagrams of another example to fabricate an electroconductive contact on a top surface of a TMR element having a diameter less than one micron.

Process 1400 is a further example of a process to fabricate an electroconductive contact on a top surface of a TMR element having a diameter less than one micron. Process 1400 deposits an insulator (1402). For example, the insulator 1301 is deposited using standard low temperature oxide deposition techniques (FIG. 13A).

Figure 13B:
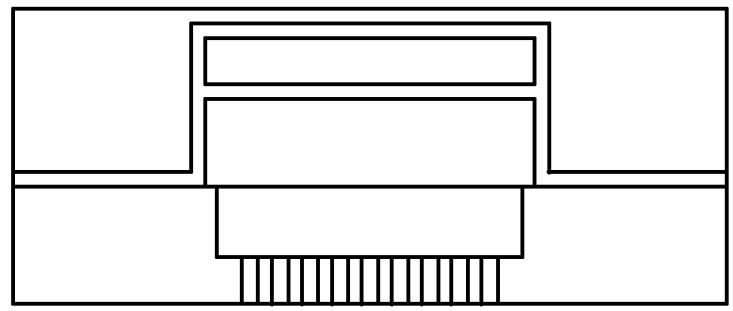

Process 1400 planarizes the insulator (1406). For example, the insulator 1301 is planarized using CMP techniques (FIG. 13B).

Figure 13C:
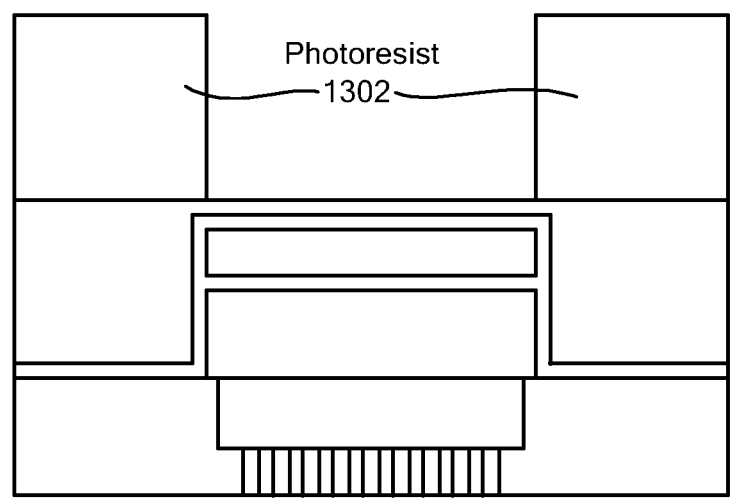
Figure 13D:
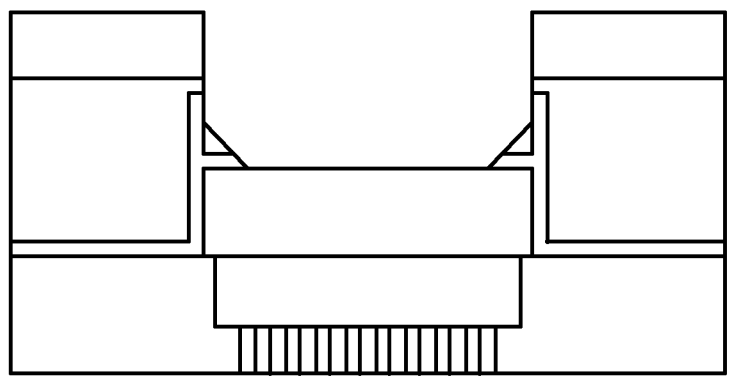
Figure 13E:
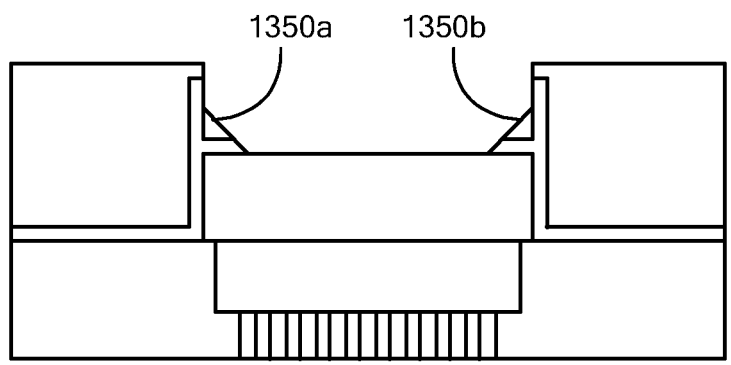
Figure 13F:
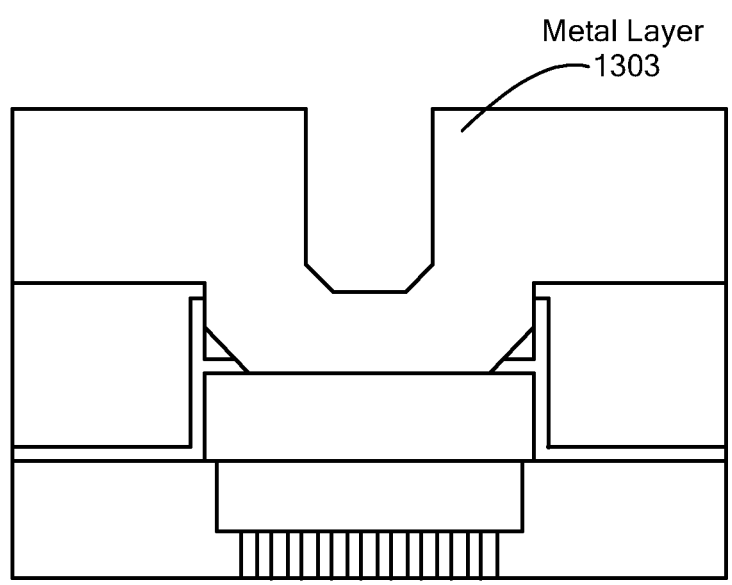
Figure 14:
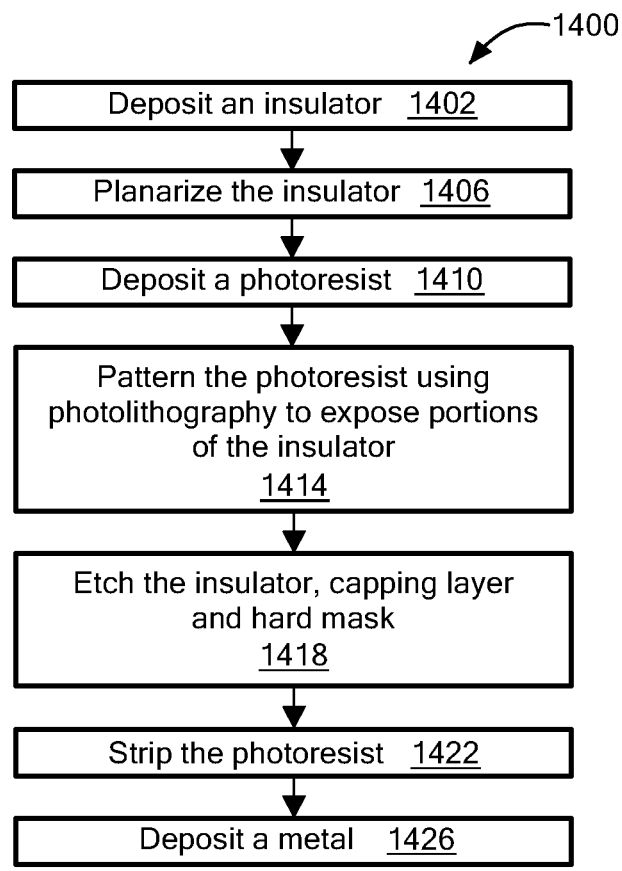
FIG. 14 is a flowchart of an example of a process to fabricate the electroconductive contact on the top surface of TMR element in FIGS. 13A to 13F.

Process 1400 deposits a photoresist (1410) and patterns the photoresist using photolithography to expose portions of the insulator (1414). For example, the photoresist 1302 is deposited and patterned using standard photolithographic techniques to expose portions of the insulator 1102 (FIG. 13C).

Process 1400 etches the insulator, the capping layer and the hard mask (1418).

Process 1400 strips the photoresist (1422). For example, the photoresist 1302 is removed using standard photoresist stripping techniques (FIG. 11E).

Process 1400 deposits a metal (1426). The metal 1303 is deposited on a portion of the top surface of the TMR element 902 and the insulator 1301 using standard metal deposition techniques (FIG. 11E).

Figure 15:
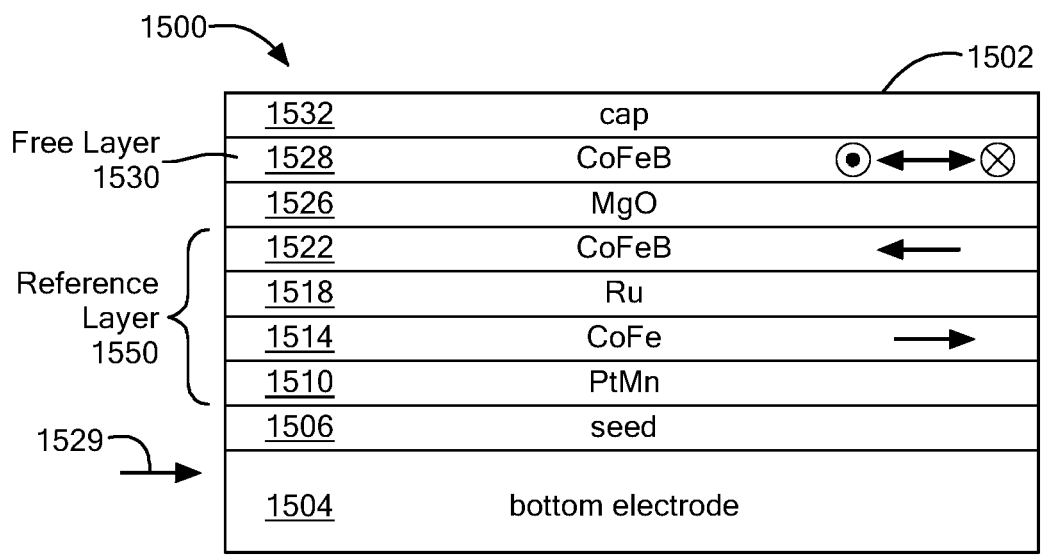
FIG. 15 is an example of a TMR element as a stack of layers.

Referring now to FIG. 15, an example of a TMR element (e.g., TMR element 12, TMR element 712, TMR element 902) is a TMR element 1500. The TMR element 1500 can have a stack 1502 of layers 1506, 1510, 1514, 1518, 1522, 1526, 1528, 1532 indicative of one pillar of a multi-pillar TMR element. Generally, the layer 1506 is a seed layer (e.g., a copper nickel (CuN) layer) with the layer 1510 located on the seed layer 1506. The layer 1510 includes platinum manganese (PtMn) or iridium manganese (IrMn), for example. The layer 1514 is located on the layer 1510 and the layer 1518 is located on the layer 1514. In one example, the layer 1514 includes cobalt iron (CoFe) and the layer 1518 is a spacer layer and includes ruthenium (Ru). On the layer 1518, a magnesium oxide (MgO) layer 1526 is sandwiched between two cobalt iron boron (CoFeB) layers 1522, 1528. A cap layer 1532 (e.g., tantalum (Ta)) is located on the CoFeB layer 1528. The layer 1514 is a single layer pinned layer that is magnetically coupled to the layer 1510. The physical mechanism that is coupling layers 1510 and 1514 together is sometimes called an exchange bias.

A free layer 1530 includes the CoFeB layer 1528. In some examples, the free layer 1530 may include an additional layer of nickel iron (NiFe) (not shown) and a thin layer of tantalum (not shown) between the CoFeB layer 1528 and the NiFe layer.

It will be understood that a driving current running through the TMR element 1500 runs through the layers of the stack, running between seed and cap layers 1506 and 1532, i.e., perpendicular to a surface of a bottom electrode 1504. The TMR element 1500 can have a maximum response axis that is parallel to the surface of the bottom electrode 104 and that is in a direction 1529, and also parallel to the magnetization direction of the reference layer 150, comprised of layers 1510, 1514, 1518, and 1522, most notably in the layer CoFeB 1522.

The TMR element 1500 has a maximum response axis (maximum response to external fields) aligned with the arrow 1529, i.e., perpendicular to bias directions experienced by the free layer 1530, and parallel to magnetic fields of the reference layer 1550, notably pinned layer 1522. Also, in general, it is rotations of the magnetic direction of the free layer 1530 caused by external magnetic fields that result in changes of resistance of the TMR element 1500, which may be due to a change in angle or a change in amplitude if an external bias is present because the sum vector of the external field and the bias is causing a change in the angle between the reference and free layers.

The processes described herein are not limited to the specific examples described. For example, the processes 200, 400, 600, 800, 1000, 1200 and 1400 are not limited to the specific processing order of FIGS. 2, 4, 6, 8, 10, 12 and 14, respectively. Rather, any of the processing blocks of FIGS. 2, 4, 6, 8, 10, 12 and 14 may be re-ordered, combined, or removed, performed in parallel or in serial, as necessary, to achieve the results set forth above. Also, the processes 1000, 1200 and 1400 are not limited to TMRs having a diameter less than a micron.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising: depositing a capping layer on a semiconductor device structure comprising: a plurality of tunneling magnetoresistance (TMR) elements; a corresponding one hard mask on each TMR element; a metal layer; and a plurality of electroconductive vias directly connecting the TMR elements to the metal layer; depositing an insulator on the capping layer; depositing a first photoresist on the insulator; patterning the first photoresist using photolithography to expose portions of the insulator; etching the exposed portions of the insulator and the hard masks to expose top surfaces of the TMR elements; stripping the first photoresist; and depositing a conducting material on the top surfaces of the TMR elements to form an electroconductive contact.

2. The method of claim 1, further comprising:
depositing a second photoresist on the conducting material;
patterning the first photoresist using photolithography to expose portions of the conducting material;
etching the exposed portions of the conducting material and the insulator material;
stripping the second photoresist; and
depositing a first passivation layer directly on the conducting material and the insulator.

3. The method of claim 2, further comprising:
performing planarization on the passivation layer;
depositing a third photoresist on the passivation layer;
patterning the third photoresist using photolithography to expose portions of the passivation layer;
etching the exposed portions of the passivation layer and the insulator material to the metal layer;
stripping the third photoresist;
depositing a metal in direct contact with the metal layer; and
depositing a second passivation layer.

4. The method of claim 2, further comprising:
performing planarization on the first passivation layer;
depositing a third photoresist on the first passivation layer;
patterning the third photoresist using photolithography to expose portions of the first passivation layer;
etching the exposed portions of the first passivation layer to the conducting material;

stripping the third photoresist;
depositing a fourth photoresist on the first passivation layer;
patterning the fourth photoresist using photolithography to expose portions of the passivation layer;
etching the exposed portions of the passivation layer and the insulator material to the metal layer;
stripping the fourth photoresist;
depositing a metal in direct contact with the metal layer and in direct contact with the conducting material;
depositing a fifth photoresist on the metal;
patterning the fifth photoresist using photolithography to expose portions of the metal;
etching the exposed portions of the metal;
stripping the fifth photoresist; and
depositing a second passivation layer.

5. The method of claim 1, wherein depositing the conducting material on the top surfaces of the TMR elements to form an electroconductive contact comprises depositing titanium nitride.

6. A method, comprising: depositing a capping layer over a semiconductor device structure comprising: a plurality of tunneling magnetoresistance (TMR) elements; a corresponding one hard mask on each TMR element; a metal layer; and a plurality of electroconductive vias directly connecting the TMR elements to the metal layer; depositing a first insulator on the capping layer; depositing a first photoresist on the insulator; patterning the first photoresist using photolithography to expose portions of the first insulator; etching the exposed portions of the first insulator and the hard masks to expose top surfaces of the TMR elements; stripping the first photoresist; and depositing a conducting material on the top surfaces of the TMR elements to form an electroconductive contact.

7. The method of claim 6, further comprising:
depositing a second insulator on the conducting material;
etching the second insulator;
planarizing the conducting material and the second insulator; and
depositing a passivation layer on the planarized conducting material and the planarized second insulator.

8. The method of claim 7, further comprising:
depositing a TMR layer;
depositing a hard mask layer;
depositing a second photoresist on the hard mask layer;
patterning the second photoresist using photolithography to expose portions of the hard mask layer;
etching the hard mask layer;
stripping the second photoresist;
etching the TMR layer to form a second plurality of TMR elements;
depositing a second capping layer on the second plurality of TMR elements;
depositing a third insulator on the second capping layer
depositing a third photoresist on the third insulator;
patterning the third photoresist using photolithography to expose portions of the third insulator;
etching the third insulator to the second plurality of TMR elements;
stripping the third photoresist; and
depositing a second conducting material in contact with the second plurality of TMR elements.

9. The method of claim 8, further comprising:
depositing a fourth photoresist on the second conducting material;
patterning the fourth photoresist using photolithography to expose portions of the second conducting material;
etching the second conducting material to the third insulator;
stripping the fourth photoresist;
depositing a fourth insulator direct contact with the second conducting material and in direct contact with the third insulator;
etching back the fourth insulator;
perform planarization on the second conducting material; and
depositing a second passivation layer on the second conducting material.

10. The method of claim 8, wherein the second conducting material, the second plurality of TMR elements; and the metal form a first TMR structure,
further comprising forming addition TMR structures.

11. The method of claim 8, wherein depositing the second conducting material in contact with the second plurality of TMR elements comprises depositing titanium nitride.

12. A method, comprising: depositing an insulator on a capping layer of a semiconductor device structure, the semiconductor structure comprising: a magnetoresistance (MR) element: a hard mask on the MR element; and the capping layer on the hard mask; depositing a first photoresist on the insulator; patterning the first photoresist using photolithography to expose portions of the insulator; etching the insulator; stripping the first photoresist; and depositing a metal on a top surface of the MR element to form an electroconductive contact, further comprising planarizing the insulator before depositing the first photoresist, wherein etching the insulator comprises etching the insulator and the hard mask exposing a top surface of the MR element and leaving a portion of the hard mask and the capping layer on each end of the MR element.

13. The method of claim 12, wherein the MR element has a diameter less than a micron.

14. The method of claim 12, wherein the MR element is a tunneling magnetoresistance element.

15. The method of claim 12, wherein etching the insulator comprises etching the insulator and the hard mask exposing the top surface of the MR element.

16. The method of claim 12, further comprising:
depositing a second photoresist on the insulator after stripping the first photoresist;
patterning the second photoresist using photolithography to expose portions of the capping layer;
etching the capping layer and the hard mask down to the MR element leaving a portion of the hard mask and the capping layer on each end of the MR element; and
stripping the second photoresist before depositing the metal on the top surface of the TMR element to form the electroconductive contact.

17. A method, comprising: depositing a capping layer on a semiconductor device structure comprising: a plurality of magnetoresistance (MR) elements; a corresponding one hard mask on each MR element; a metal layer; and a plurality of electroconductive vias directly connecting the MR elements to the metal layer; depositing an insulator on the capping layer; depositing a first photoresist on the insulator; patterning the first photoresist using photolithography to expose portions of the insulator; etching the exposed portions of the insulator and the hard masks to expose top surfaces of the MR elements; stripping the first photoresist; and depositing a conducting material on the top surfaces of the MR elements to form an electroconductive contact.

18. The method of claim 17, further comprising:
depositing a second photoresist on the conducting material;
patterning the first photoresist using photolithography to expose portions of the conducting material;
etching the exposed portions of the conducting material and the insulator material;
stripping the second photoresist; and
depositing a first passivation layer directly on the conducting material and the insulator.

19. The method of claim 18, further comprising:
performing planarization on the passivation layer;
depositing a third photoresist on the passivation layer;
patterning the third photoresist using photolithography to expose portions of the passivation layer;
etching the exposed portions of the passivation layer and the insulator material to the metal layer;
stripping the third photoresist;
depositing a metal in direct contact with the metal layer; and
depositing a second passivation layer,
wherein depositing the conducting material on the top surfaces of the MR elements to form an electroconductive contact comprises depositing titanium nitride.

20. The method of claim 18, further comprising:
performing planarization on the first passivation layer;
depositing a third photoresist on the first passivation layer;
patterning the third photoresist using photolithography to expose portions of the first passivation layer;
etching the exposed portions of the first passivation layer to the conducting material;
stripping the third photoresist;
depositing a fourth photoresist on the first passivation layer;
patterning the fourth photoresist using photolithography to expose portions of the passivation layer;
etching the exposed portions of the passivation layer and the insulator material to the metal layer;
stripping the fourth photoresist;
depositing a metal in direct contact with the metal layer and in direct contact with the conducting material;
depositing a fifth photoresist on the metal;
patterning the fifth photoresist using photolithography to expose portions of the metal;
etching the exposed portions of the metal;
stripping the fifth photoresist; and
depositing a second passivation layer,
wherein depositing the conducting material on the top surfaces of the MR elements to form an electroconductive contact comprises depositing titanium nitride.

* * * * *